(12) United States Patent
Sato et al.

(10) Patent No.: US 7,489,577 B2
(45) Date of Patent: Feb. 10, 2009

(54) MAGNETIC MEMORY DEVICE AND METHOD FOR READING THE SAME

(75) Inventors: Yoshihiro Sato, Kawasaki (JP); Masaki Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 88 days.

(21) Appl. No.: 11/808,967

(22) Filed: Jun. 14, 2007

(65) Prior Publication Data

US 2007/0247943 A1    Oct. 25, 2007

Related U.S. Application Data

(63) Continuation of application No. PCT/JP2004/018757, filed on Dec. 15, 2004.

(51) Int. Cl.
*G11C 7/02* (2006.01)
(52) U.S. Cl. .................... 365/210.1; 365/158; 365/171; 365/173; 365/207
(58) Field of Classification Search ............. 365/210.1, 365/207, 158, 171, 173
See application file for complete search history.

(56) References Cited

U.S. PATENT DOCUMENTS

| | | | |
|---|---|---|---|
| 6,349,054 B1 | 2/2002 | Hidaka | |
| 7,187,577 B1 * | 3/2007 | Wang et al. | 365/158 |
| 7,272,034 B1 * | 9/2007 | Chen et al. | 365/158 |
| 2002/0037595 A1 | 3/2002 | Hosotani | |
| 2002/0154538 A1 | 10/2002 | Inui | |
| 2002/0190291 A1 | 12/2002 | Hosotani | |
| 2003/0142540 A1 | 7/2003 | Tanizaki et al. | |

FOREIGN PATENT DOCUMENTS

| | | |
|---|---|---|
| JP | 2002-110933 A | 4/2002 |
| JP | 2002-367366 A | 12/2002 |
| JP | 2003-109375 A | 4/2003 |
| JP | 2003-228974 A | 8/2003 |

OTHER PUBLICATIONS

M. Durlam et al.; "A low power 1Mbit MRAM based on 1T1MTJ bit cell integrated with Copper Interconnects"; 2002 Symposium on VLSI Circuits Digest of Technical Papers.

(Continued)

*Primary Examiner*—Pho M. Luu
(74) *Attorney, Agent, or Firm*—Westerman, Hattori, Daniels & Adrian, LLP.

(57) ABSTRACT

A magnetic memory device comprises a plurality of bit lines BL; memory cells MC disposed at the respective plurality of bit lines, and each including a magnetoresistive effect element MTJ whose resistance value is changed with changes of magnetization direction, and a select transistor Tr connected to the magnetoresistive effect element MTJ, the magnetoresistive effect element MC having one terminal connected to the bit line BL and the other terminal connected to a first signal line GND via the select transistor; dummy cells DC disposed at the respective plurality of bit lines BL, and each including a resistance element R of a constant resistance value, the resistance element having one terminal connected to the bit line BL and the other terminal connected to a second signal line $SIG_D$; and a voltage sense amplifier SA connected to the plurality of bit lines BL.

19 Claims, 20 Drawing Sheets

OTHER PUBLICATIONS

T. INABA et al.; "Resistance Ratio Read ($R^3$) Architecture for a Burst Operated 1.5V MRAM Macro"; IEEE 2003 Custom Integrated Circuits Conference, pp. 399-402.

J. Nahas et al.; "A 4Mb 0.18μm 1T1MTJ Toggle MRAM Memory"; 2004 IEEE International Solid-State Circuits Conference, pp. 44-45.

International Search Report of PCT/JP2004/018757, date of mailing Apr. 12, 2005.

* cited by examiner

MAGNETIC MEMORY DEVICE AND METHOD FOR READING THE SAME

CROSS REFERENCE TO RELATED APPLICATIONS

This application is a Continuation of International Application No. PCT/JP2004/018757, with an international filing date of Dec. 15, 2004, which designating the United States of America, the entire contents of which are incorporated herein by reference.

TECHNICAL FIELD

The present invention relates to a magnetic memory device, more specifically, a magnetic memory device utilizing resistance changes due to magnetization directions of magnetic layers, and a method for reading the same.

BACKGROUND ART

Recently, the magnetic random access memory (hereinafter called MRAM) including magnetoresistive effect elements arranged in a matrix is noted as a rewritable nonvolatile memory. The MRAM utilizes combinations of the magnetization directions of two magnetic layers to memorize information and detects resistance changes (i.e., current or voltage changes) between a resistance given when the magnetization directions of the magnetic layers are parallel with each other and a resistance given when the magnetization directions of the magnetic layers are antiparallel with each other to thereby read the memorized information.

As one of the magnetoresistive effect elements forming the MRAM, magnetic tunnel junction (hereinafter called MTJ) element is known. The MTJ element includes two ferromagnetic layers laid one on another with a tunnel insulating film formed therebetween and utilizes the phenomena that the tunnel current flowing between the ferromagnetic layers via the tunnel insulating film changes based on relationships between the magnetization directions of the two ferromagnetic layers. That is, the MTJ element has low element resistance when the magnetization directions of the two ferromagnetic layers are parallel with each other and when they are antiparallel with each other, the MTJ element has high element resistance. These two states are related to data "0" and data "1" to use the MTJ element as a memory element. The MTJ element, which is thus a memory element utilizing changes of the element resistance must convert resistance changes to voltages or currents to read the memorized information.

The method for reading the conventional magnetic memory device will be explained with reference to FIGS. 18 to 20.

The magnetic memory device shown in FIG. 18 has a memory cell 100 formed of one select transistor 102 and one MTJ element 104 (1T-1MTJ type). The select transistor 102 and the MTJ element 104 are serially connected. The end on the side of the MTJ element 104 is connected to a current source 106, and the end on the side of the select transistor 102 is grounded.

A cell of a reference side is the same in the basic structure as that of the memory side and has one select transistor 102r and one MTJ element 104r. The resistance value of the MTJ element 104r of the cell of the reference side is, e.g., the medium value between a resistance value of the MTJ element 104 of the memory side in the high resistance state and a resistance value thereof in the low resistance state.

When the select transistor 102 is turned on, and a current is flowed from the current source 106 to the MTJ element 104, a voltage corresponding to memorized information (resistance value) written in the MTJ element 104 to the terminal of the MTJ element 104 on the current source side 106. That is, when the MTJ element 104 is in the high resistance state, a high level voltage is outputted, and a low level voltage is outputted when the MTJ element 104 is in the low resistance state. This voltage outputted from the cell of the memory side and the cell of the reference side is amplified by a sense amplifier (not shown) connected to the next stage and compared, whereby the memorized information in the cell of the memory side can be read.

The read circuit of the magnetic memory device shown in FIG. 18 is described in, e.g., M. Durlam et al., "A low power 1 Mbit MRAM based on 1T1MTJ bit cell integrated with Copper Interconnects", 2002 Symposium on VLSI Circuits Digest of Technical Papers.

The magnetic memory device shown in FIG. 19 has a memory cell 100 formed of two select transistors 102a, 102b and two MTJ elements 104, 104b (2T-2MTJ type). In the MTJ elements 104a, 104b, complementary resistance states are written. That is, a high resistance state is written in one of the MTJ elements 104a, 104b and a low resistance state is written in the other.

The select transistor 102a and the MTJ element 104a, and the select transistor 102b and the MTJ element 104b are respectively serially connected. The select transistor 102a and the select transistor 102b are connected to each other at the terminals which are opposite to the terminals connected to the MTJ elements 104a, 104b. The other terminal of the MTJ element 104a is connected to a constant voltage Vd, and the other terminal of the MTJ element 104b is grounded.

When the select transistors 102a, 102b are turned on, a current flows through the serial connection of the MTJ element 104a, the select transistor 102a, the select transistor 102b and the MTJ element 104b. Thus, voltages corresponding to memorized information written in the MTJ elements 104a, 104b are outputted to the connection node between the select transistor 102a and the select transistor 102b. That is, due to the resistance voltage division between the MTJ element 104a and the MTJ element 104b, when the MTJ element 104a is in the low resistance state, and the MTJ element 104b is in the high resistance state, a high level voltage is outputted, and a low level voltage is outputted when the MTJ element 104a is in the high resistance state, and the MTJ element 104b is in the low resistance state. A voltage $V_{sig}$ outputted from the cell of the memory side and a reference voltage $V_{ref}$ are amplified by a sense amplifier (not shown) connected to the next stage and compared, whereby the memorized information in the cell of the memory side can be read.

The read circuit of the magnetic memory device shown in FIG. 19 is described in, e.g., T. Inaba et al., "Resistance Ration Read (R3) Architecture for a Burst Operated 1.5V MRAM Macro", IEEE 2003 Custom Integrated Circuits Conference, pp. 399-402.

The magnetic memory device shown in FIG. 20 has a memory cell 100 of 1T-1MTJ type including a select transistor 102 and an MTJ element 104. On the reference side, a cell including a high resistance MTJ element 104h and a cell including a low resistance MTJ element 104L are formed. A current mirror sense amplifier 110 as the amplifier of the first stage is connected to the cell of the memory side and the cells of the reference side via a clamp transistor 108.

When a current flowing in the MTJ element 104H is $I_H$, and a current flowing in the MTJ element 104L is $I_L$, currents supplied from the current mirror sense amplifier 110 to three signal lines connected thereto are respectively $(I_H+I_L)/2$. Accordingly, a voltage at the node N1 of the memory side and a voltage at the node N2 of the reference side are amplified by an amplifier (not shown) connected to the next stage and compared, whereby memorized information in the cell of the memory side can be read.

The read circuit of the magnetic memory device shown in FIG. 20 is described in, e.g., J. Nahas et al., "A 4 Mb 0.18-micron 1T1MTJ Toggle MRAM Memory", 2004 IEEE International Solid-State Circuits Conference, pp. 44-45.

DISCLOSURE OF INVENTION

Problems to be Solved by the Invention

However, the conventional magnetic memory device shown in FIG. 18 can realize the minimum cell area by the 1T-MTJ memory cell, but on the other hand, the current source which requires a large area must be provided as a peripheral circuit, and the peripheral circuit occupies a large area. Furthermore, the current injection reading method requires large electric power consumption.

The conventional magnetic memory device shown in FIG. 19 can make the peripheral circuit relatively small by using a voltage source and the voltage sense circuit. However, due to the 2T-2MTJ type memory cell, the integration in the memory region is halved in comparison with that of the 1T-1MTJ type magnetic memory device.

The conventional magnetic memory device shown in FIG. 20 can realize the minimum cell area by the 1T-1MTJ type memory cell. However, the use of the current mirror sense circuit and the large clamp transistor make the peripheral circuit large. The current sense mode makes the current consumption large.

Thus, an MRAM comprising, for high integration and low electric power consumption, a memory cell array of the minimum 1T-1MTJ type but a read circuit which can use a voltage source and a voltage sense amplifier which can allow the peripheral circuit to be small has been expected.

An object of the present invention is to provide a magnetic memory device which facilitates high integration and low electric power consumption, and a method for reading such magnetic memory device.

Means for Solving the Problems

According to one aspect of the present invention, there is provided a magnetic memory device comprising: a plurality of bit lines; memory cells disposed at respective of the plurality of bit lines and each of the memory cell including a magnetoresistive effect element and a select transistor connected to the magnetoresistive effect element, the magnetoresistive effect element having one terminal connected to the bit line and the other terminal connected to a first signal line via the select transistor; first dummy cells disposed at respective of the plurality of bit lines, and each of the first dummy cell including a resistance element of a constant resistance value, the resistance element having one terminal connected to the bit line and the other terminal connected to a second signal line; and a voltage sense amplifier connected to the plurality of bit lines.

According to another aspect of the present invention, there is provided a method for reading a magnetic memory device, including a memory cell including a magnetoresistive effect element whose resistance value is changed with changes of a magnetization direction and a select transistor connected to the magnetoresistive effect element, the magnetoresistive effect element having one terminal connected to a first bit line and the other terminal connected to a first signal line via the select transistor; a first dummy cell including a resistance element of a constant resistance value, the resistance element having one terminal connected to the first bit line and the other terminal connected to a second signal line; and a voltage sense amplifier connected to the first bit line, comprising the steps of: applying a prescribed read voltage between the first signal line and the second signal line; and reading information memorized in the memory cell by amplifying and comparing a voltage difference between a signal voltage outputted to the first bit line and a reference voltage by the voltage sense amplifier.

According to further another aspect of the present invention, there is provided a method for reading a magnetic memory device, including a plurality of bit lines divided in a plurality of pairs of adjacent two bit lines; memory cells disposed at respective of the plurality of bit lines and each of the memory cell including a magnetoresistive effect element whose resistance value is changed with changes of a magnetization direction, and a select transistor connected to the magnetoresistive effect element, the magnetoresistive effect element having one terminal connected to the bit line and the other terminal connected to a first signal line via the select transistors; first dummy cells disposed at the respective plurality of bit lines and each including a resistance element of a constant voltage value, the resistance element having one terminal connected to the bit line and the other terminal connected to a second signal line; and a plurality of voltage sense amplifiers connected to the respective plurality of pairs of the bit lines, comprising the steps of: applying a prescribed read voltage between the first signal line and the second signal line; and simultaneously reading information memorized in the memory cells disposed at said plurality of pairs by the voltage sense amplifier by amplifying and comparing a voltage difference between a signal voltage outputted to the first bit line and a reference voltage.

Effect of the Invention

According to the present invention, dummy cells each including a resistance element of a constant resistance value and a select transistor connected to the resistance element are disposed at respective bit lines, whereby the read voltage is divided by a resistance ratio between the magnetoresistive effect element of the memory cell and the resistance element of the dummy cell, which allows the memory cells to have the cell structure including minimum one magnetoresistive effect element (e.g., 1T-1MTJ type). The read circuit can be formed of the constant-voltage source and the voltage sense amplifier, which allows the area of the peripheral circuit to be small. Thus, the magnetic memory device can be integrated and can have low electric power consumption.

The magnetic tunnel junction element is used as the magnetoresistive effect element, whereby the resistance change of the magnetoresistive effect element can be large. Thus, the operation of the voltage sense amplifier can be sped up, and the reading operation can be more reliable.

The resistance element of the dummy cells have the same layer structure as the magnetoresistive effect elements of the memory cells, whereby the dummy cells and the memory cells can be simultaneously formed, and the manufacturing process can be simplified. This decreases the manufacturing cost. Furthermore, the resistance elements of the dummy cells and the magnetoresistive effect elements of the memory cells have the same area, whereby the dummy cells and the memory cells can be manufactured indiscriminately, which can decrease the fluctuations of these devices in size.

Between the bit lines and the voltage sense amplifier, the connection transistors for controlling the connection therebetween is provided, whereby the voltage sense can be sped up and also can protect the magnetoresistive effect elements of the memory cells from large voltages generated when the voltage sense amplifier is operated.

Two dummy cells are provided for each bit line, whereby the reference voltage can be generated by the resistance voltage division between the two dummy cells connected to one bit line. The resistance values of the resistance elements of the two dummy cells connected to one bit line are made equal to each other, which simplifies design and facilitates the manufacturing process.

EXPLANATION OF REFERENCE NUMERALS

Figure 1:
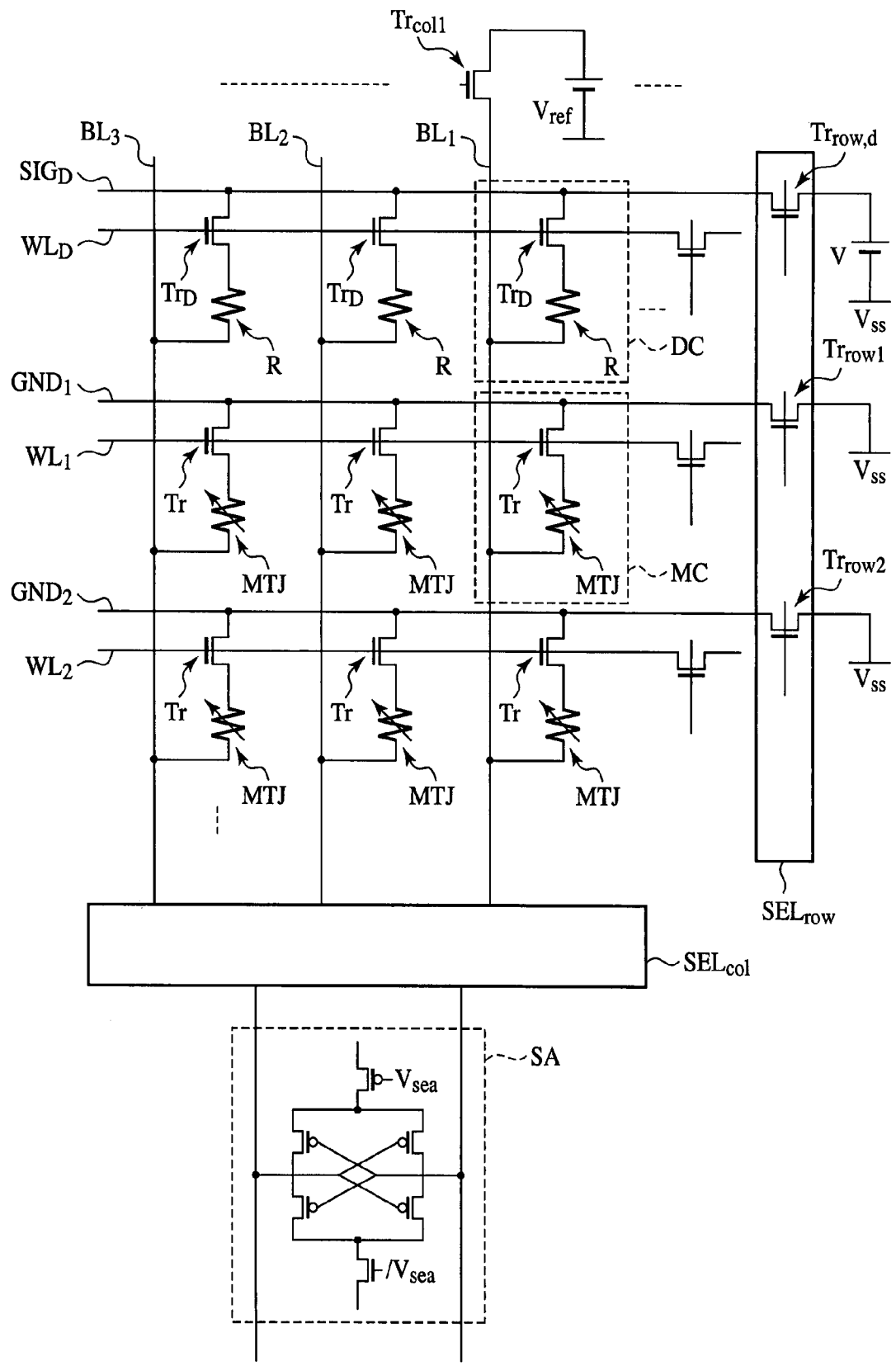
FIG. 1 is a circuit diagram showing a structure of the magnetic memory device according to a first embodiment of the present invention.

10 . . . silicon substrate
12 . . . device isolation film
14 . . . gate electrode
16, 18 . . . source/drain regions
20, 28, 40, 64 . . . inter-layer insulating films
22, 42 . . . contact holes
24, 44 . . . contact plugs
26 . . . ground line
30 . . . interconnection trench
32 . . . Ta film
34 . . . NiFe film
36 . . . Cu film
38 . . . write word line
46 . . . lower electrode layer
48 . . . anti-ferromagnetic layer
50, 54, 58 . . . ferromagnetic layers
52 . . . non-magnetic layer
56 . . . tunnel insulating film
60 . . . cap layer
62 . . . MTJ element
66 . . . bit line
100 . . . memory cell
102 . . . select transistor
104 . . . MTJ element
106 . . . current source
108 . . . clamp transistor
110 . . . current mirror sense amplifier

BEST MODE FOR CARRYING OUT THE INVENTION

A First Embodiment

The magnetic memory device according to a first embodiment of the present invention will be explained with reference to FIGS. 1 to 9.

Figure 2:
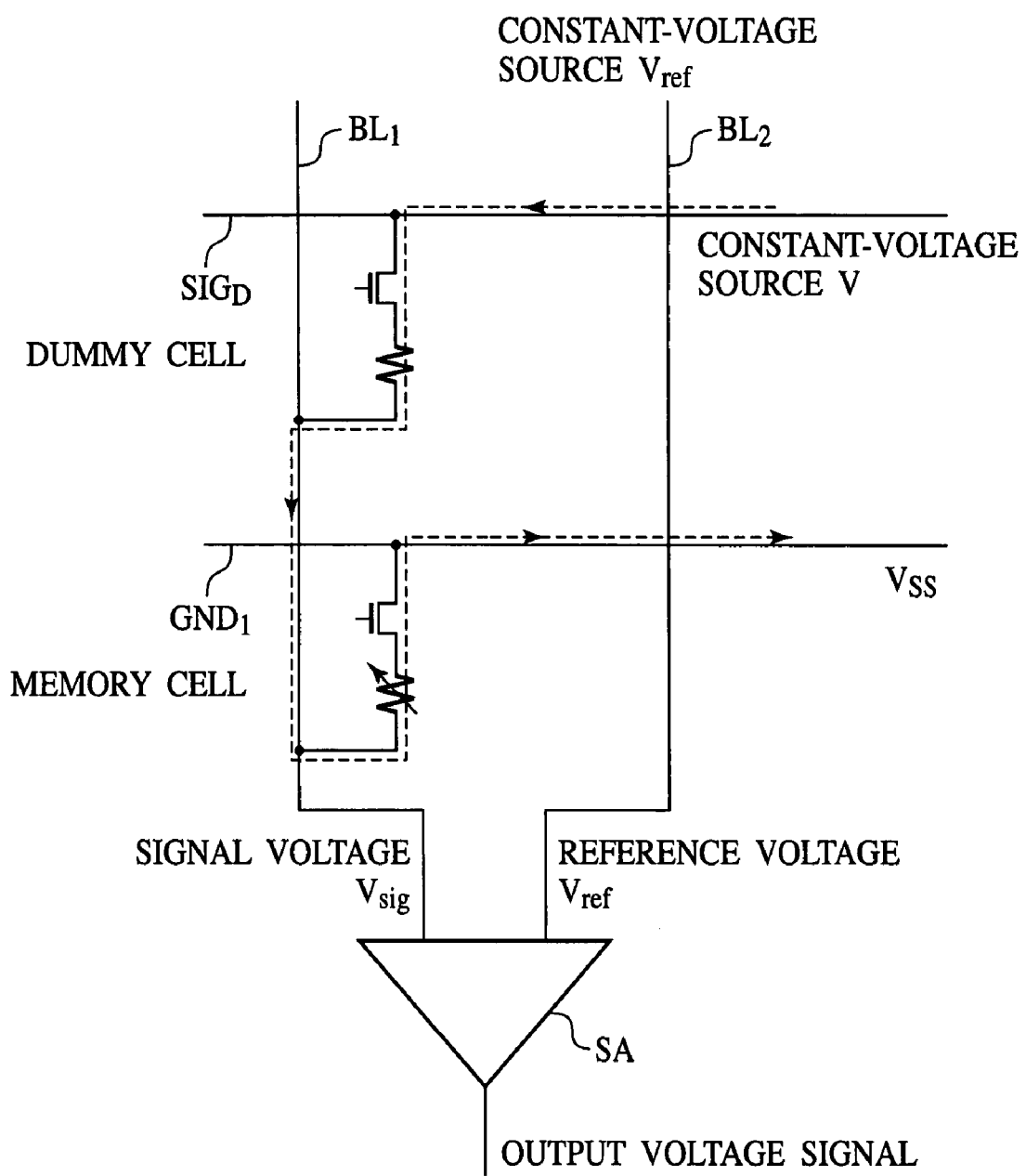
FIG. 2 is a view showing a method for reading the magnetic memory device according to the first embodiment of the present invention (Part 1).
Figure 3:
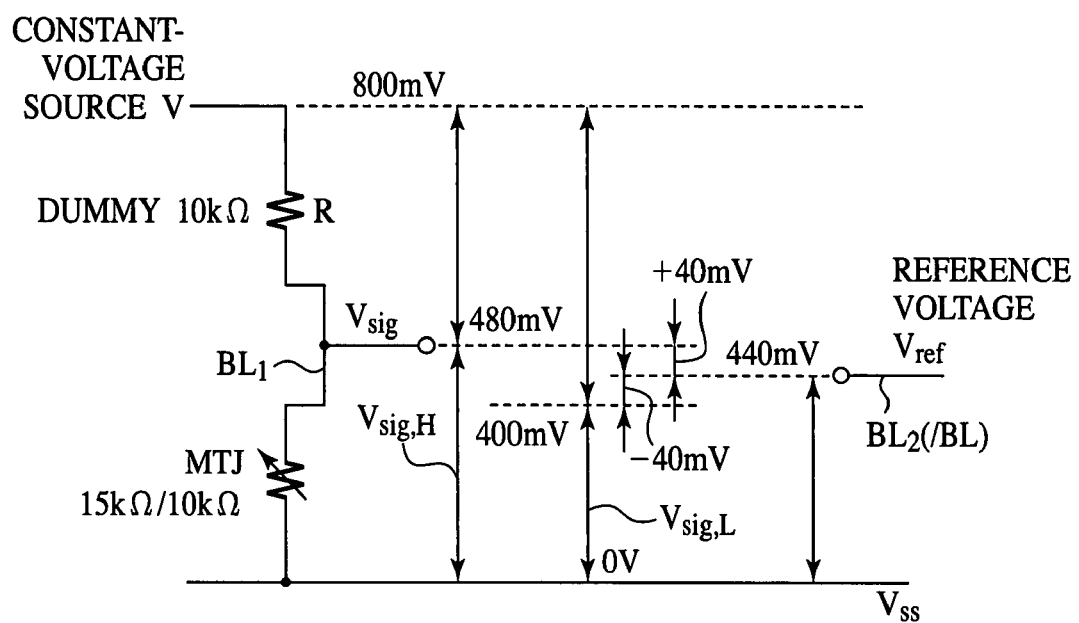
FIG. 3 is a view showing a method for reading the magnetic memory device according to the first embodiment of the present invention (Part 2).
Figure 4:
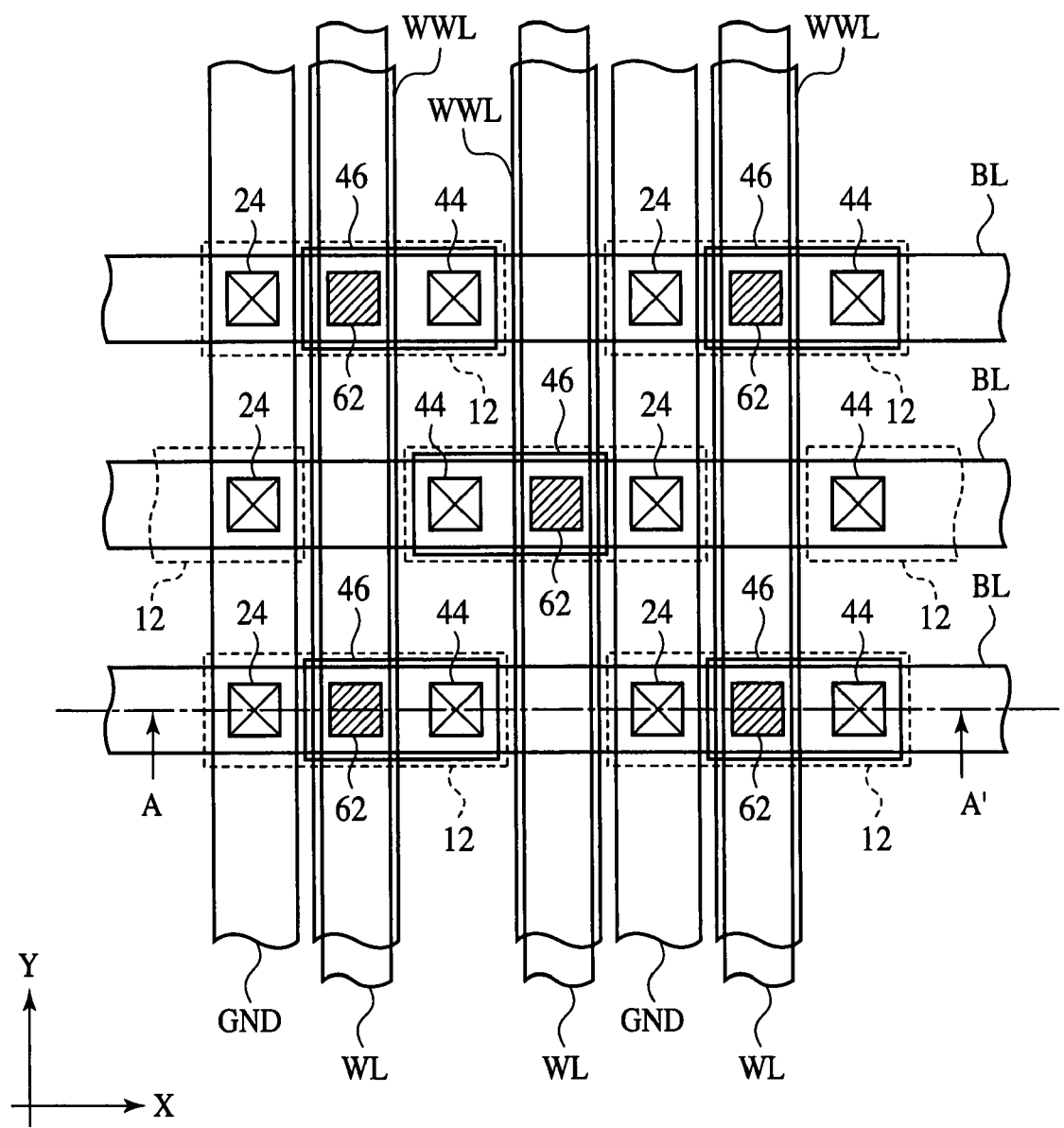
FIG. 4 is a plan view showing the structure of the magnetic memory device according to the first embodiment of the present invention.
Figure 5:
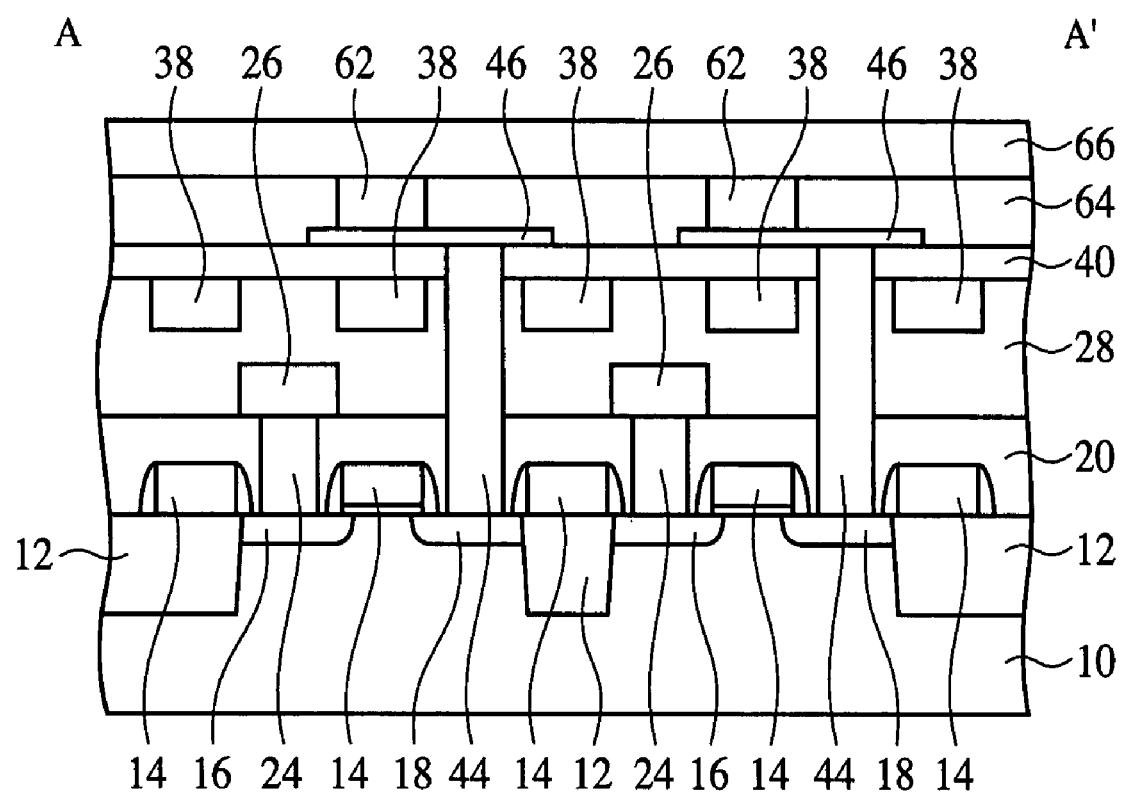
FIG. 5 is a diagrammatic sectional view showing the structure of the magnetic memory device according to the first embodiment of the present invention.
Figure 6:
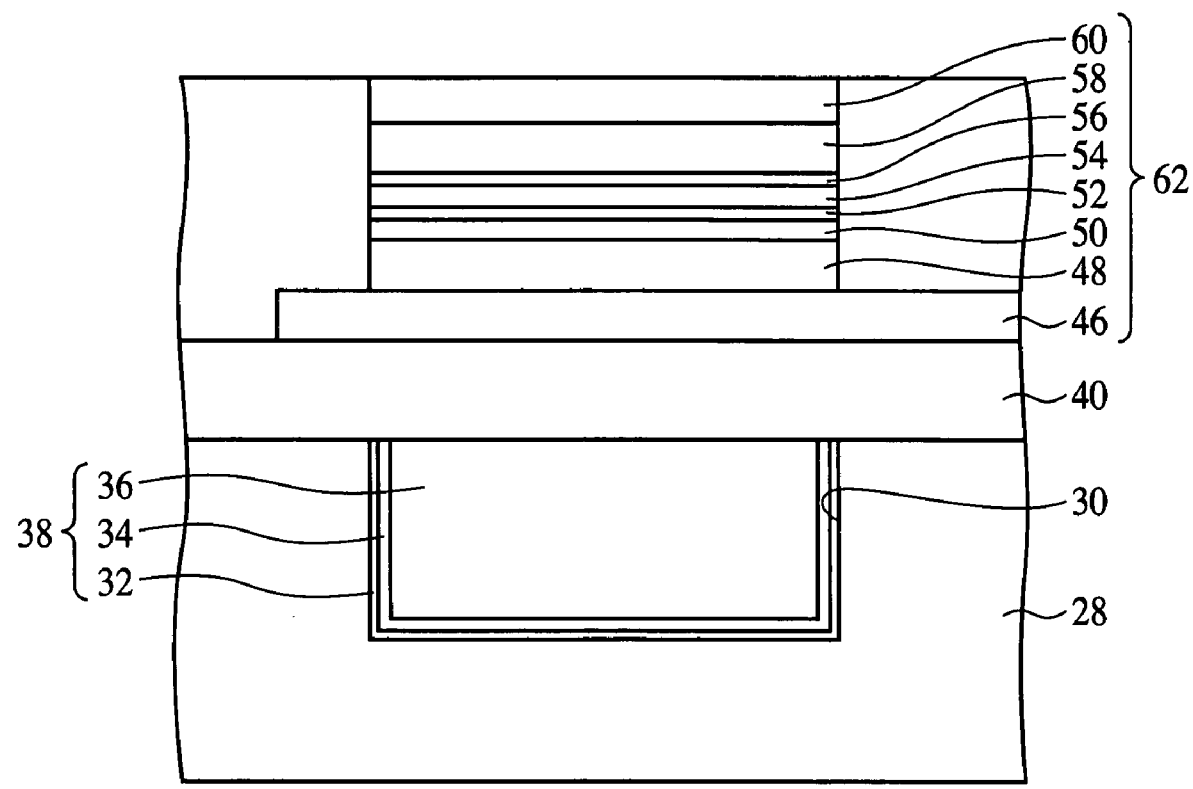
FIG. 6 is an enlarged sectional view of the magnetic memory device according to the first embodiment of the present invention.

FIG. 1 is a circuit diagram showing a structure of the magnetic memory device according to the present embodiment. FIGS. 2 and 3 are views showing the method for reading the magnetic memory device according to the present embodiment. FIG. 4 is a plan view showing the structure of the magnetic memory device according to the present embodiment. FIG. 5 is a diagrammatic sectional view showing the structure of the magnetic memory device according to the present embodiment. FIG. 6 is an enlarged sectional view of the magnetic memory device according to the present embodiment. FIGS. 7 to 9 are sectional views showing a method of manufacturing the magnetic memory device according to the present embodiment.

First, the structure of the magnetic memory device according to the present embodiment will be explained with reference to FIG. 1.

The magnetic memory device according to the present embodiment includes memory cells MC of 1T-1MTJ type each having one select transistor Tr and one MTJ element arranged in a matrix row-wise (horizontally as viewed in the drawing) and column-wise (vertically as viewed in the drawing).

The memory cells MC arranged row-wise include a word line WL commonly connecting the gate terminals of the select transistors Tr contained in the memory cells MC, and a ground line GND commonly connecting those of the source/drain terminals of the select transistors Tr, which are opposite to those connected to the MTJ elements MTJ. The word line WL and the ground line GND are provided for each row of the memory cells MC.

The memory cells MC arranged column-wise include a bit line BL commonly connected to those of the terminals of the MTJ elements MTJ, which are opposite to those connected to the select transistors Tr. The bit line BL is provided for each column of the memory cells MC.

Dummy cells DC are provided each on one ends of the respective bit lines BL adjacent to the memory cells MC. Each dummy cell DC includes one select transistor $TR_D$ and a resistance element R connected to the select transistor $Tr_D$. Each resistance element R is a resistance element of a certain resistance value.

The dummy cells MC arranged row-wise include a word line $WL_D$ commonly connecting the gate terminals of the select transistors $TR_D$ included in the dummy cells DC and a signal line $SIG_D$ commonly connecting those of the source/drain terminals of the select transistors $Tr_D$, which are opposite to those connected to the resistance element R. Those of the terminals of the resistance elements R, which are opposite to those connected to the select transistors $Tr_D$ are connected respectively to the associated bit lines BL.

One ends of the respective bit lines BL are connected to constant-voltage sources $V_{ref}$ for reference via column select transistors $Tr_{col}$. The other ends of the respective bit lines BL are connected to a voltage sense amplifier SA via a column select circuit $SEL_{col}$. The voltage sense amplifier SA can be a cross connected type sense amplifier as exemplified in the drawing.

One ends of the respective ground lines GND connected to the memory cells MC are connected to a standard voltage $V_{ss}$ via row select transistors $Tr_{row}$. The standard voltage $V_{ss}$ can be, e.g., the earth potential. The signal line $SIG_D$ connected to the dummy cells DC is connected to a constant-voltage source V via a row select transistor $Tr_{row,d}$. The row select transistors $Tr_{row}$, $Tr_{row,d}$ are collectively called a row select circuit $SEL_{row}$.

Then, the method for reading the magnetic memory device according to the present embodiment will be explained with reference to FIGS. 1 to 3.

Here, the case that information memorized in the memory cell MC connected to the word line $WL_1$, the ground line $GND_1$ and the bit line $BL_1$ (memory cell enclosed by the dotted line in FIG. 1) is read will be described.

When the row select transistor $Tr_{row1}$ associated with the ground line $GND_1$ connected to the memory cell MC to be read, and the row select transistor $Tr_{row,d}$ associated with the signal line $SIG_D$ connected to the dummy cell DC are turned on, and the select transistors Tr of the memory cell MC and the dummy cell DC are turned on, as shown in FIG. 2, a serial connection of the signal line $SIG_D$, the dummy cell DC, the bit line $BL_1$, the memory cell MC and the ground line $GND_1$ are sequentially connected to each other is formed. Then, via this serial connection, a current flows from the signal line $SIG_D$ to the ground line $GND_1$.

A reference voltage $V_{ref}$ is applied to the adjacent bit line $BL_2$. That is, the column select transistor $Tr_{col2}$ (not shown) connected to one end of the bit line $BL_2$ is turned on, and the constant-voltage source $V_{ref}$ is connected to the bit line $BL_2$. The bit line BL used for the reference is not essentially to the adjacent bit line and can be an arbitrary bit line.

FIG. 3 is an equivalent circuit of the state shown in FIG. 2. To simplify the description, the respective select transistors are ignored. It is assumed that the voltage of the constant-voltage source to be applied to the signal line $SIG_D$ is 800 mV, the resistance value of the resistance element R of the dummy cell DC is 10 kΩ, the resistance value of the MTJ element MTJ of the memory cell MC in the high resistance state is 15 kΩ, and the resistance value in the low resistance state is 10 kΩ.

When the MTJ element MTJ is in the high resistance state, the voltage of the connection node between the resistance element R of the dummy cell DC and the MTJ element MTJ of the memory cell MC, i.e., the voltage $V_{sig,H}$ of the bit line $BL_1$ is, due to the resistance voltage division, $V_{sig,H}$=800 mV×15 kΩ/(10 kΩ+15 kΩ)=480 mV.

When the MTJ element MTJ is in the low resistance state, the voltage $V_{sig,L}$ of the bit line $BL_1$ is, due to the resistance voltage division, is $V_{sig,L}$=800 mV×10 kΩ/(10 kΩ+15 kΩ)=400 mV.

On the other hand, to the bit line $BL_2$ to be used as the bit line of the reference side (/BL), a reference voltage $V_{ref}$ of a voltage between the voltage $V_{sig,L}$ and the voltage $V_{sig,H}$, e.g., 440 mV is applied. When the reference voltage $V_{ref}$ is set at 440 mV, the reference voltage has an about 40 mV voltage margin with respect to the signal voltage $V_{sig,L}$ and the signal voltage $V_{sig,H}$.

In this state, the bit line $BL_1$ with the signal voltage $V_{sig}$ applied to and the bit line $BL_2$ (/BL) with the reference voltage $V_{ref}$ applied to are selected by the column select circuit $SEL_{col}$ and connected to the voltage sense amplifier SA. The voltage difference ±40 mV between the signal voltage $V_{sig}$ of the bit line $BL_1$ and the reference voltage $V_{ref}$ of the bit line $BL_2$ is amplified, whereby the information memorized in the MTJ element can be read.

Next, one example of specific memory cell structure for realizing the circuit shown in FIG. 1 will be explained with reference to FIGS. 4 to 6.

A device isolation film 12 for defining a plurality of active regions is formed on the silicon substrate 10. Each active region is a rectangular shape which is elongated in the X direction. The plural regions are arranged zigzag to each other.

Over the silicon substrate 10 with the device isolation film 12 formed on, a plurality of word lines WL extended in Y direction are formed. The word lines WL are extended each in each active region. Source/drain regions 16, 18 are formed in each active region on both sides of the word line WL. Thus, the select transistor having a gate electrode 14 functioning as the word line WL, and the source/drain regions 16, 18 is formed in each active region.

An inter-layer insulating film 20 is formed over the silicon substrate 10 with the select transistors formed on. In the inter-layer insulating film 20, contact plugs 24 connected to the source/drain regions 16 formed in the contacts of the active regions are buried. Over the inter-layer insulating film 20, a plurality of ground lines 26 (GND) extended in the Y-direction and electrically connected to the source/drain regions 16 via the contact plugs 24 are formed.

An inter-layer insulating film 28 is formed over the inter-layer insulating film 20 with the ground lines 26 formed on. In the inter-layer insulating film 28, a plurality of write word lines 38 (WWL) extended in the Y-direction are buried. The write word lines 38 are formed each over each word line WL. As shown in FIG. 6, the write word lines are formed of a Ta film 32 formed, as the barrier metal, over the inside walls of the interconnection trenches 30, an NiFe film 34 of high magnetic permeability provided for increasing the magnetic field, and a Cu film 36 which is the major interconnections.

Over the inter-layer insulating film 28 with the write word lines 38 buried in, an inter-layer insulating film 40 is formed. In the inter-layer insulating films 40, 28, 20, contact plugs 44 connected to the source/drain regions 18 are buried in.

Over the inter-layer insulating film 40 with the contact plugs 44 buried in, lower electrode layers 46 electrically connected to the source/drain regions 18 via the contact plugs 44 are formed. On the lower electrode layers 36, MTJ elements 62 are formed. The MTJ elements 62 are formed each in the regions where the active regions and the write word lines 38 intersect each other. As shown in FIG. 6, the MTJ elements 62 are formed of an anti-ferromagnetic layer 48 of PtMn film, a ferromagnetic layer 50 of CoFe film, a non-magnetic layer 52 of Ru, a ferromagnetic layer 54 of CoFe film, a tunnel insulating film 56 of alumina film, a ferromagnetic layer 58 of NiFe film and a cap layer 60 of Ta film. The ferromagnetic layer 50, the non-magnetic layer 52 and the ferromagnetic layer 54 form a pinned magnetization layer, and the ferromagnetic layer 58 forms a free magnetization layer.

On the inter-layer insulating film 40 except the regions where the MTJ elements 62 are formed, an inter-layer insulating film 64 is formed. On the inter-layer insulating film 40 with the MTJ elements 62 buried in, a plurality of bit lines 64 (BL) electrically connected to the MTJ elements 62 at the cap layer 60 and extended in the X-direction are formed.

The dummy cells DC may have the same cell structure as the memory cells MC. The MTJ elements are devices which inverses a magnetization direction of the free magnetization layer by the application of a magnetic field to switch a resistance state, but when the MTJ elements are used in one resistance state (e.g., low resistance state) alone, the MTJ elements can be considered as resistance elements. Accordingly, the resistance elements R can be formed of MTJ elements of the same structure as the MTJ elements of the memory cells. The resistance elements R are formed of MTJ elements, whereby no step of forming the resistance elements R is additionally required, and the manufacturing method can be simplified.

The resistance elements R of the dummy cells DC can be formed by forming a junction area corresponding to a required resistance value. For example, when the MTJ elements of a 0.4×0.8 μm area has, e.g., 10 kΩ in the low resistance state and, e.g., 15 kΩ in the high resistance state, the area of the resistance elements R of the dummy cells DC can be 0.4×0.64 μm to form the resistance elements R of 12.5 kΩ.

The resistance elements R of the dummy cells DC are not essentially MTJ elements and can be formed of resistors, e.g., polycrystalline silicon resistors or others, other than MTJ elements.

Next, the method of manufacturing the magnetic memory device according to the present embodiment will be explained with reference to FIGS. 7 to 9. FIGS. 7 to 9 are sectional views showing the method of manufacturing the magnetic memory device according to the present embodiment. FIGS. 7 to 9 are the sectional views along the line A-A' in FIG. 4.

First, the device isolation film 12 is formed on the silicon substrate 10 by, e.g., STI (Shallow Trench Isolation) method.

Figure 7A:
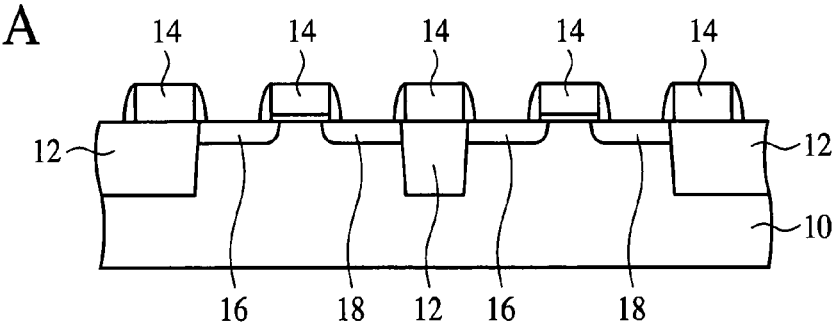
FIG. 7 is sectional views showing the method of manufacturing the magnetic memory device according to the first embodiment of the present invention (Part 1).

Next, the select transistors Tr each including the gate electrode 14 and the source/drain regions 16, 18 are formed in the active regions defined by the device isolation film 12 by the same process for forming the usual MOS transistors (FIG. 7A). The select transistors Tr are formed each in each active region. The gate electrodes 14 are formed extended vertically as viewed in the drawing and, as shown in FIGS. 1 and 4, form the word lines WL functioning also as the gate electrodes 14 of the plurality of select transistors Tr.

Then, over the silicon substrate 10 with the select transistors Tr formed on, a silicon oxide film is deposited by, e.g., CVD method, and surface thereof is planarized by CMP method to form the inter-layer insulating film 20 of the silicon oxide film.

Then, the contact holes 22 down to the source/drain regions 16 are formed in the inter-layer insulating film 20 by photolithography and dry etching.

Figure 7B:
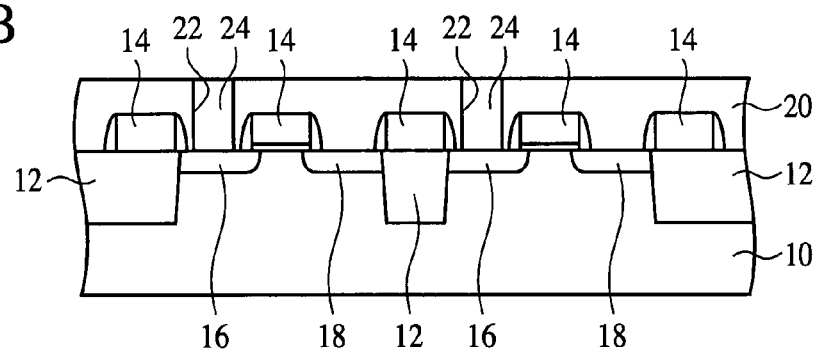

Next, a titanium nitride film as the barrier metal and a tungsten film are deposited by, e.g., CVD method, and then these conductive films are etched or polished back to form the contact plugs 24 buried in the contact holes 22 and electrically connected to the source/drain regions 16 (FIG. 7B).

Then, a conductive film is deposited over the inter-layer insulating film 20 with the contact plugs 24 buried in and is patterned to form the ground lines 26 electrically connected to the source/drain regions 16 via the contact plugs 24. The ground lines 25 (GND) are formed, extended in a direction crossing the word lines WL as shown in FIGS. 1 and 4.

Figure 7C:
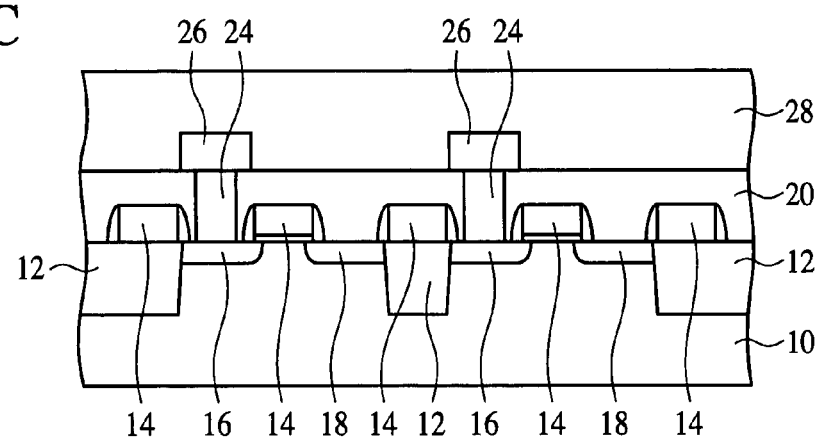

Next, over the inter-layer insulating film 20 with the ground lines 26 formed on, a silicon oxide film is deposited by, e.g., CVD method, and the surface thereof is planarized by CMP method to form the inter-layer insulating film 28 of the silicon oxide film (FIG. 7C).

Figure 7D:
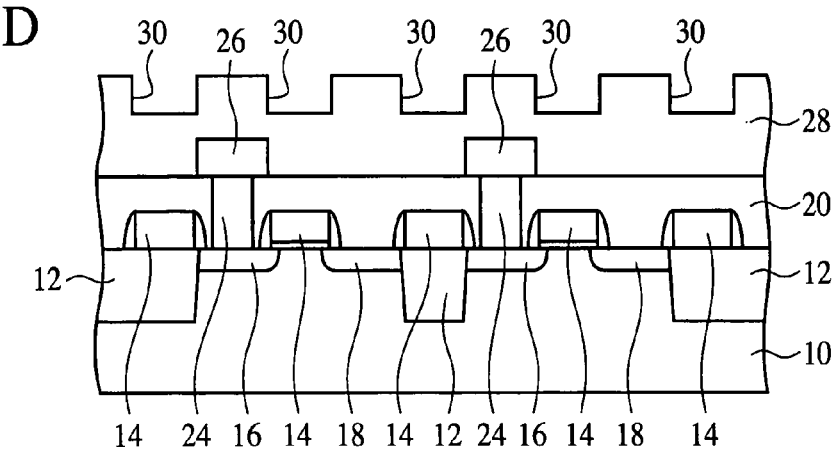

Then, by photolithography and etching, the interconnection trenches 30 for burying the write word lines to be buried in are formed in the inter-layer insulating film 28 (FIG. 7D).

Figure 8A:
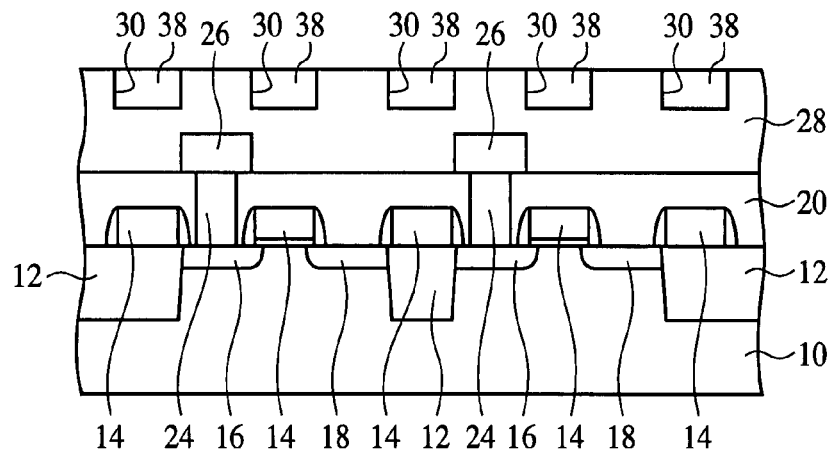
FIG. 8 is sectional views showing the method of manufacturing the magnetic memory device according to the first embodiment of the present invention (Part 2).

Next, the Ta film 32 and the NiFe film 34 are deposited by, e.g., sputtering method, and the Cu film 36 is deposited by, e.g., electroplating method. Then, these conductive films are planarized by CMP method, and the write word lines 38 buried in the interconnection trenches 30 are formed (FIGS. 6 and 8A). As shown in FIG. 4 the write word lines 38 (WWL) are formed, extended in a direction parallel with the word lines WL.

Then, over the inter-layer insulating film 28 with the write word lines 38 buried in, a silicon oxide film is deposited by, e.g., CVD method, and the surface thereof is planarized by CMP method to form the inter-layer insulating film 40 of the silicon oxide film.

Next, the contact holes 42 down to the source/drain regions 18 are formed in the inter-layer insulating films 40, 28, 30 by photolithography and dry etching.

Figure 8B:
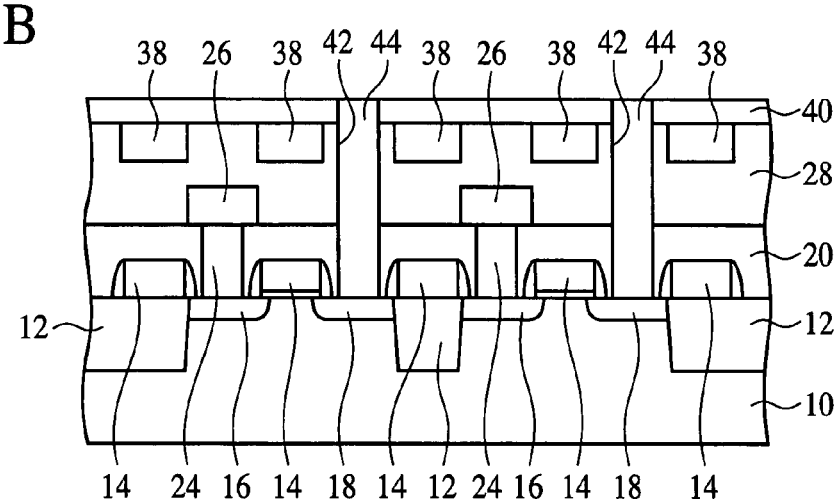

Next, a titanium nitride film as the barrier metal and a tungsten film are deposited by, e.g., CVD method, and these conductive films are etched back or polished back to form the contact plugs 44 buried in the contact holes 42 and electrically connected to the source/drain regions 18 (FIG. 8B).

Figure 8C:
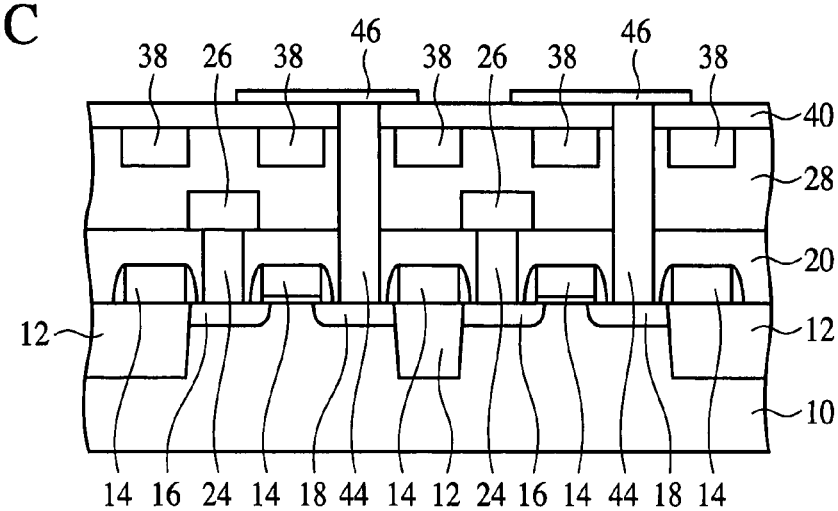

Next, a 40 nm-thickness Ta film, for example, is deposited by, e.g., sputtering method, then patterned by photolithography and dry etching to form the lower electrode layers 46 electrically connected to the source/drain diffused layer 18 via the contact plugs 44 (FIG. 8C).

Then, the anti-ferromagnetic layer 48 of, e.g., a 15 nm-thickness PtMn, the ferromagnetic layer 50 of, e.g., a 2 nm-thickness CoFe, the non-magnetic layer 52 of, e.g., a 0.9 nm-thickness Ru, the ferromagnetic layer 54 of, e.g., a 3 nm-thickness CoFe, the tunnel insulating film 56 of, e.g., a 2 nm-thickness alumina, the ferromagnetic layer 58 of, e.g., a 6 nm-thickness NiFe, and the cap layer 60 of, e.g., a 30 nm-thickness Ta film are formed by, e.g., sputtering method.

Figure 9A:
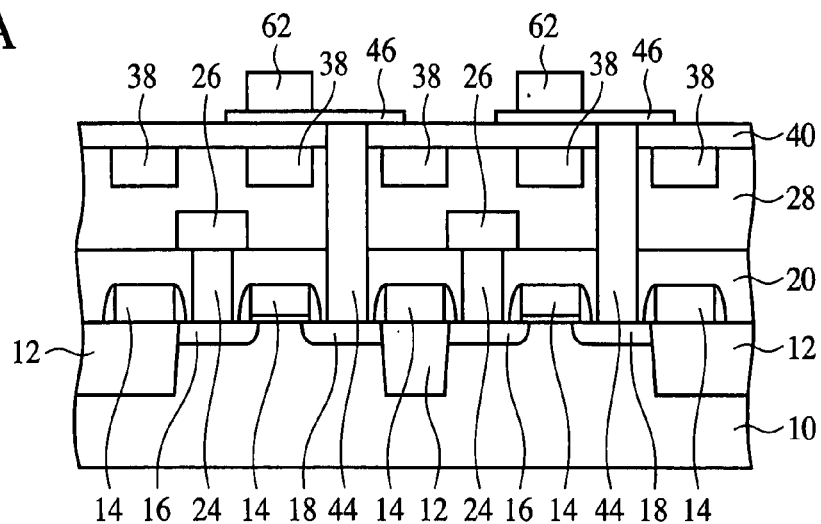
FIG. 9 is sectional views showing the method of manufacturing the magnetic memory device according to the first embodiment of the present invention (Part 3).

Next, the cap layer 60, the ferromagnetic layer 58, the tunnel insulating film 56, the ferromagnetic layer 54, the non-magnetic layer 52, the ferromagnetic layer 50 and the anti-ferromagnetic layer 48 are patterned by photolithography and dry etching to form the MTJ elements 62 electrically connected to the source/drain regions 18 of the select transistors Tr via the lower electrode layers 46 and the contact plugs 44 (FIGS. 6 and 9A). The ferromagnetic layer 50, the non-magnetic layer 52 and the ferromagnetic layer 54 form the pinned magnetization layer, and the ferromagnetic layer 58 forms the free magnetization layer.

Figure 9B:
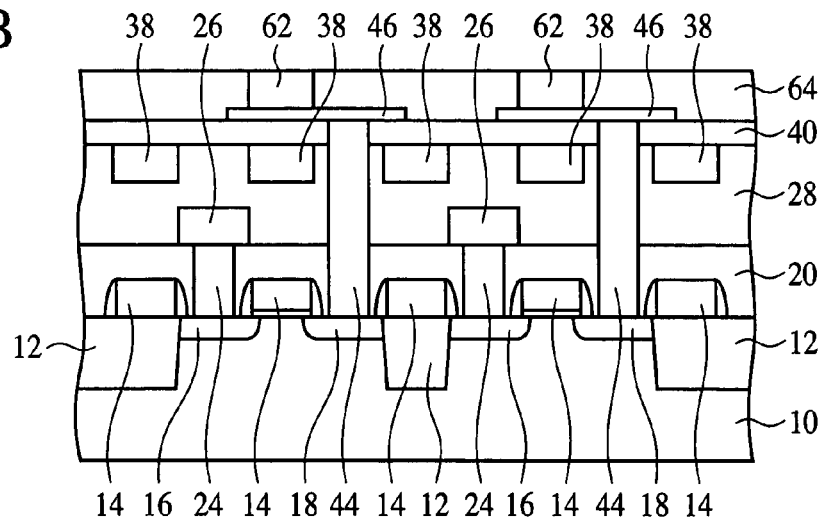

Next, over the inter-layer insulating film 40 with the MTJ elements formed on, a silicon oxide film is deposited by, e.g., CVD method, the silicon oxide film is planarized by CMP method until the MTJ elements 62 are exposed, and the inter-layer insulating film 64 of silicon oxide film having the surface planarized is formed (FIG. 9B).

Figure 9C:
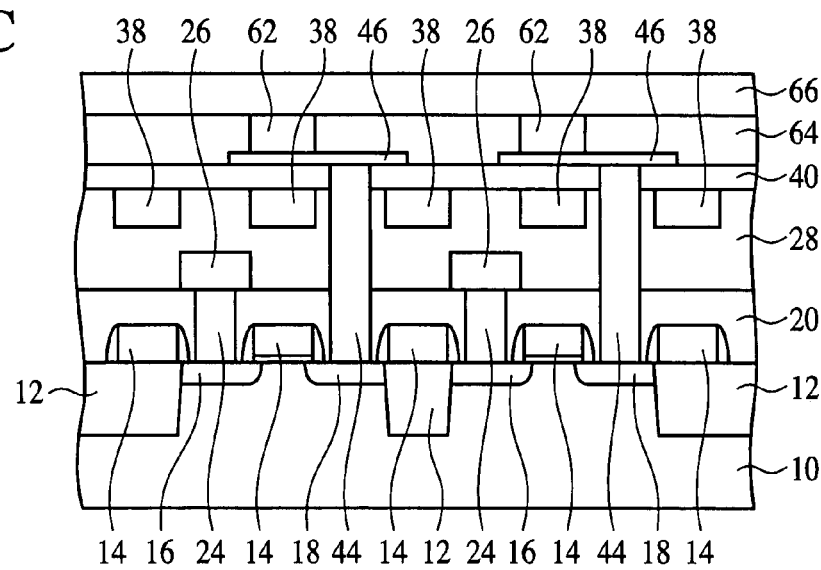

Then, a conductive film is deposited on the inter-layer insulating film 64 with the MTJ elements 62 buried in and is patterned to form the bit lines 66 (BL) connected to the MTJ elements 62 (FIG. 9C). As shown in FIGS. 1 and 4, the bit lines 66 are extended in a direction intersecting the word lines WL, the write word lines WWL and the ground lines GND.

Then, insulating layers, interconnection layers, etc. are formed thereon as required, and the magnetic memory device is completed.

As described above, according to the present embodiment, a dummy cell including a resistance element and a select transistor connected thereto is provided on each bit line to thereby divide a read voltage by a resistance ratio between the magnetoresistive effect element of a memory cell and the resistance element of the dummy cell, whereby the memory cell can have the cell structure including the minimum one magnetoresistive effect element (e.g., 1T-1MTJ type). The read circuit can be formed of the constant-voltage source and the voltage sense amplifier, whereby the area of the peripheral circuit can be made small. Thus, the magnetic memory device can be integrated and can have small electric power consumption.

The magnetoresistive effect element is a magnetic tunnel junction element, whereby the resistance change of the magnetoresistive effect element can be made large. Thus, the operation of the voltage sense amplifier can be sped up, and the reading operation can be made more reliable.

The resistance elements of the dummy cells comprise the elements of the same layer structure as the magnetoresistive effect elements of the memory cells, whereby the dummy cells and the memory cells can be concurrently formed, which simplifies the manufacturing process and can decrease the manufacturing cost. Furthermore, the resistance elements of the dummy cells and the magnetoresistive effect elements of the memory cells have the same area, which permits the dummy cells and the memory cells to be formed indiscriminately in the same size, whereby the fluctuations of the size of these elements can be decreased.

A Second Embodiment

Figure 11:
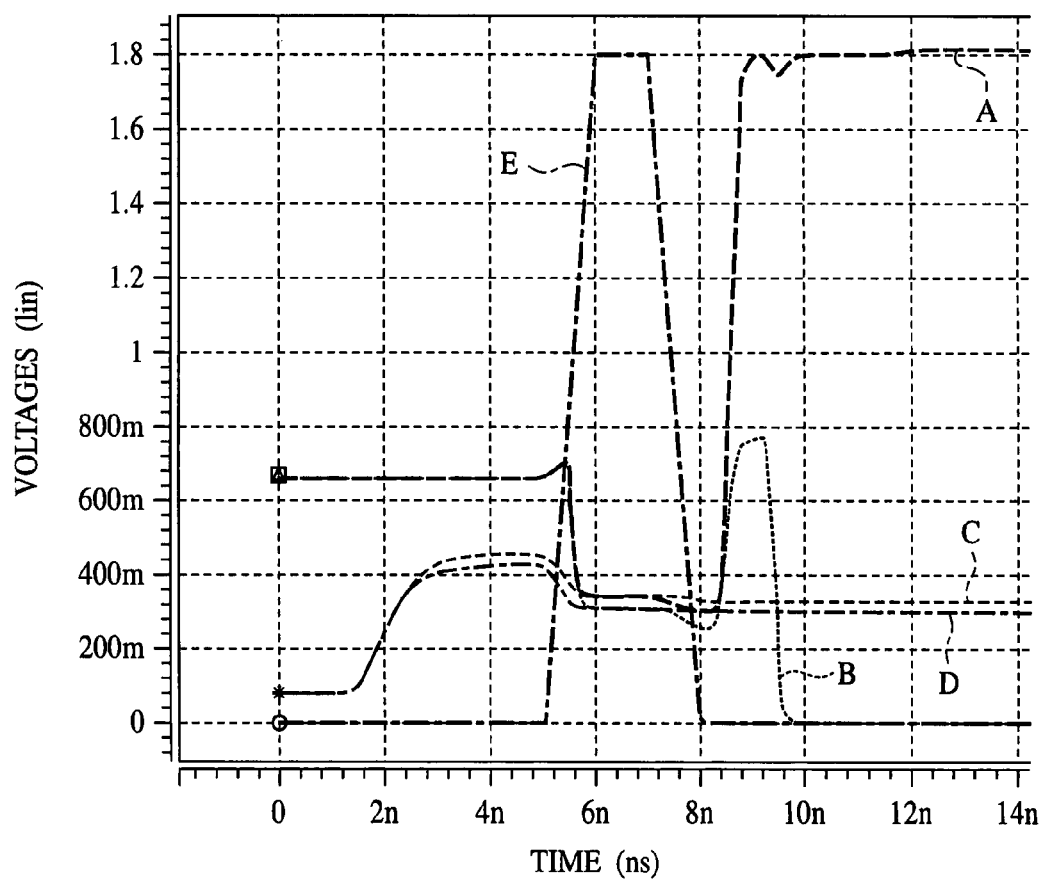
FIG. 11 is a time chart showing the timing of the reading operation of the magnetic memory device according to the second embodiment of the present invention.
Figure 12:
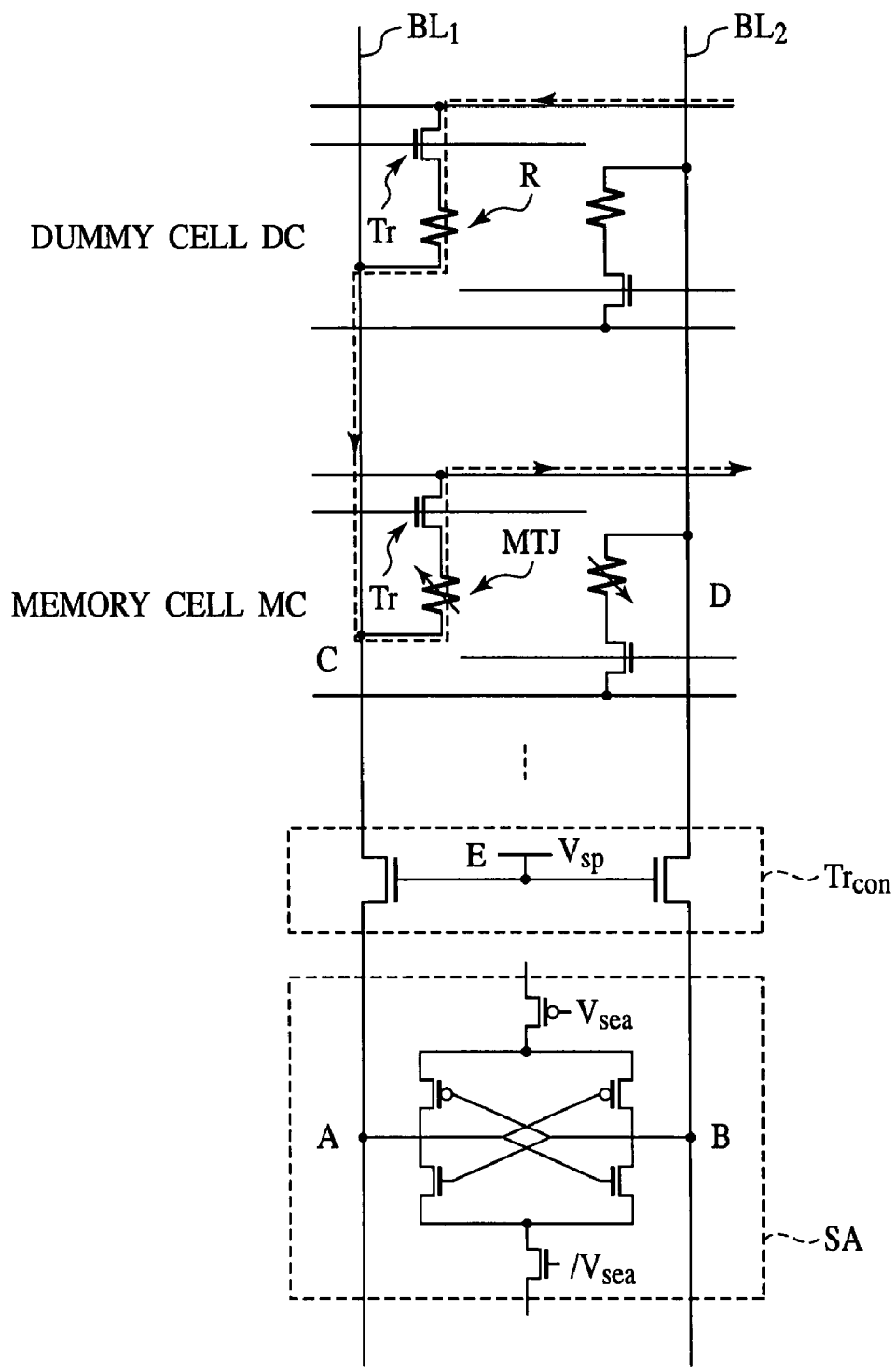
FIG. 12 is a view showing the measurement nodes of the voltages shown in the time chart of FIG. 11.

The magnetic memory device according to a second embodiment of the present invention will be explained with reference to FIGS. 10 to 12. The same members of the present embodiment as those of the magnetic memory device according to the first embodiment shown in FIGS. 1 to 9 are represented by the same reference numbers not to repeat or to simplify their explanation.

Figure 10:
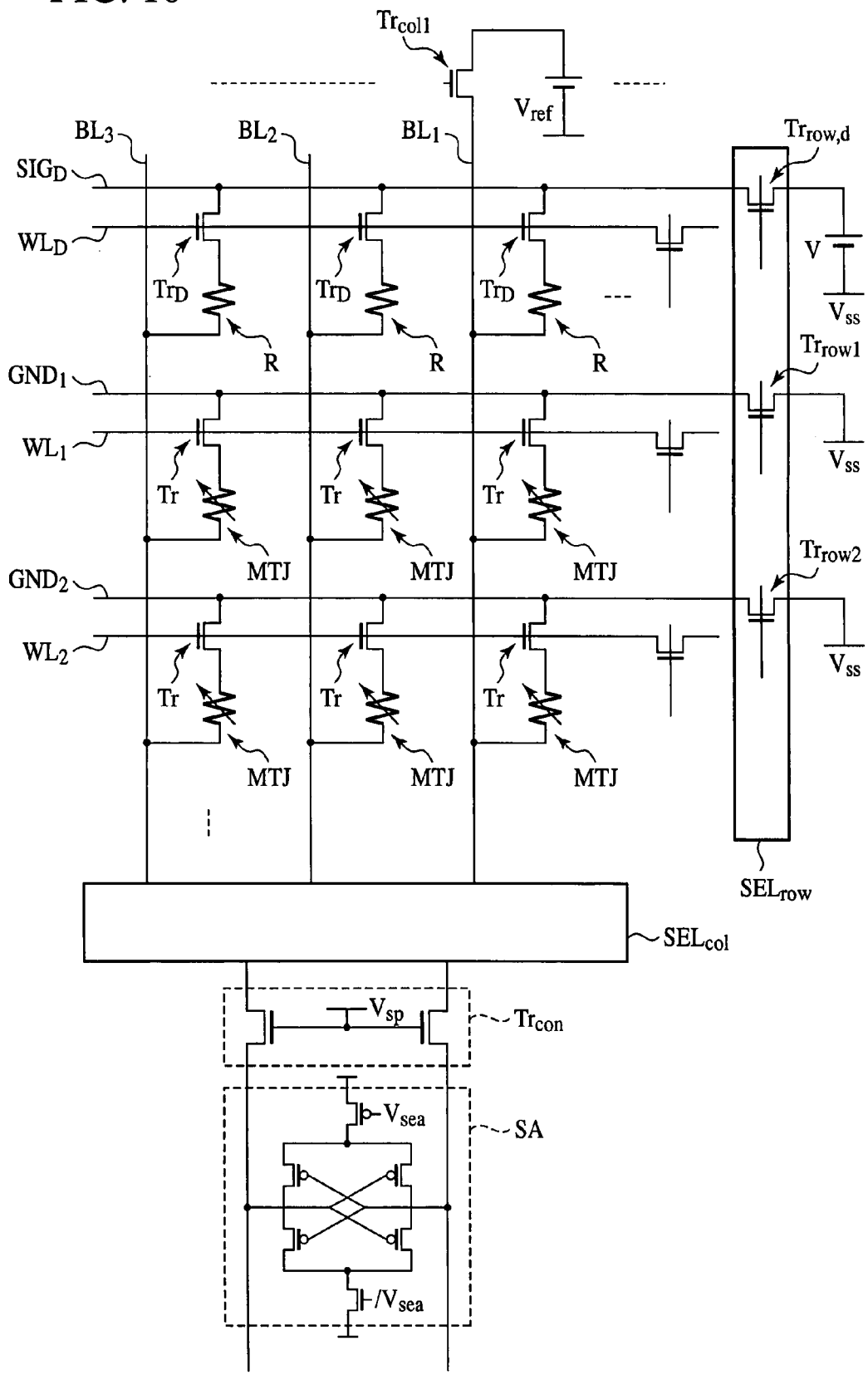
FIG. 10 is a circuit diagram showing a structure of the magnetic memory device according to a second embodiment of the present invention.

FIG. 10 is a circuit diagram showing the structure of the magnetic memory device according to the present embodiment. FIG. 11 is the time chart showing the timing of the reading operation. FIG. 12 is a view showing the measurement nodes for the voltages shown in the time chart of FIG. 11.

First, the structure of the magnetic memory device according to the present embodiment will be explained with reference to FIG. 10.

As shown in FIG. 10, the memory cell array of the magnetic memory device according to the present embodiment is the same as that of the magnetic memory device according to the first embodiment. The magnetic memory device according to the present embodiment is characterized mainly in that connection transistors $Tr_{con}$ for controlling the connection with the bit lines are provided between a column select circuit $SEL_{col}$ and a voltage sense amplifier SA. The connection transistors $Tr_{con}$ may be included in the column select circuit $SEL_{col}$.

Then, the method for reading the magnetic memory device according to the present embodiment will be explained with reference to FIGS. 11 and 12.

In the pre-reading state, both signal lines (A and B in the chart) of the voltage sense amplifier are charged with a prescribed voltage. In the time chart of FIG. 11, both signal lines are pre-charged with an about 680 mV.

In this state, the select transistors Tr of the memory cell MC to be read and the dummy cell DC are tuned on, and the associated row select transistors $Tr_{row1}$, $Tr_{row,d}$ are turned on by the row select circuit $SEL_{row}$. Thus, a current flows via the select transistor Tr of the dummy cell DC, the resistance element R, the MTJ element MTJ and the select transistor Tr of the memory cell MC, and the bit line $BL_1$ has a voltage corresponding to the resistance state of the MTJ element MTJ (C in the chart). In the time chart of FIG. 11, the voltage of the bit line BL is raised to about 480 mV.

The column select transistor $Tr_{col2}$ is turned on, and the reference voltage $V_{ref}$ is applied to the bit line $BL_2$ to be the bit line of the reference side (/BL) (D in the chart). In the time chart of FIG. 11, the voltage of the bit line $BL_2$ is increased to about 440 mV, which is the reference voltage $V_{ref}$.

Then, a drive voltage $V_{sp}$ is applied to the connection transistor $Tr_{con}$ (E in the chart), and the bit line BL and the bit line of the reference side (/BL) are connected to the voltage sense circuit SA. Thus, the voltage of the bit line BL (C in the chart) and the voltage of one signal line of the voltage sense amplifier SA (A in the chart) become equal to each other, and the voltage of the bit line of the reference side (/BL) (D in the chart) and the voltage of the other signal line of the voltage sense amplifier SA become equal to each other.

Next, the connection transistor $Tr_{con}$ is turned off, and the bit lines BL and the voltage sense amplifier SA are disconnected from each other.

Then, a voltage $/V_{sea}$ is applied to the gate electrode of the Pch transistor of the voltage sense amplifier SA, and subsequently, the voltage $V_{sea}$ is applied to the gate electrode of the Nch transistor of the voltage sense amplifier SA to drive the voltage sense amplifier SA. Thus, the voltage of one of both signal lines of the voltage sense amplifier having a higher voltage is raised to the source voltage $V_{dd}$, and the voltage of the other of both signal lines is lowered to the earth potential. In the time chart of FIG. 11, the voltage of the signal line connected to the bit line BL (A in the chart) is raised to the source voltage $V_{dd}$, and the voltage of the signal line connected to the bit line of the reference side (/BL) (B in the chart) is lowered to the earth voltage. Thus, the voltage of the bit line BL and the voltage of the bit line of the reference side /BL can be easily detected, and the information memorized in the memory cell can be read.

In reading operation of the magnetic memory device according to the present embodiment described above, the connection transistor $Tr_{con}$ plays the role of accurately transmitting output signals from the memory cells MC to the voltage sense amplifier SA while preventing damages, etc. of the MTJ elements MTJ.

That is, when the voltage sense amplifier SA is operated, without the connection transistor $Tr_{con}$ or with the connection transistor $Tr_{con}$ set on, the source voltage $V_{dd}$ is applied to the MTJ elements of the memory cells MC. Consequently, there are risks that the output signals might become erroneous and the MTJ elements might be damaged, resultantly impairing the reliability. The connection transistor $Tr_{con}$ is provided to thereby disconnect the voltage sense amplifier from the memory cells when the voltage sense amplifier is operated, whereby the above-described risks can be prevented.

As described above, according to the present embodiment, between the bit lines and the voltage sense amplifier, the connection transistors for controlling the connection therebetween is provided, whereby the voltage sense can be sped up, and also the MTJ elements of the memory cells are protected from the dielectric breakdown of the tunnel insulating film due to high voltages generated when the voltage sense amplified is operated.

A Third Embodiment

The magnetic memory device according to a third embodiment of the present invention will be explained with reference to FIG. 13.

The same members of the present embodiment as those of the magnetic memory device according to the first and the second embodiments shown in FIGS. 1 to 12 are represented by the same reference number not to repeat or to simplify their explanation.

Figure 13:
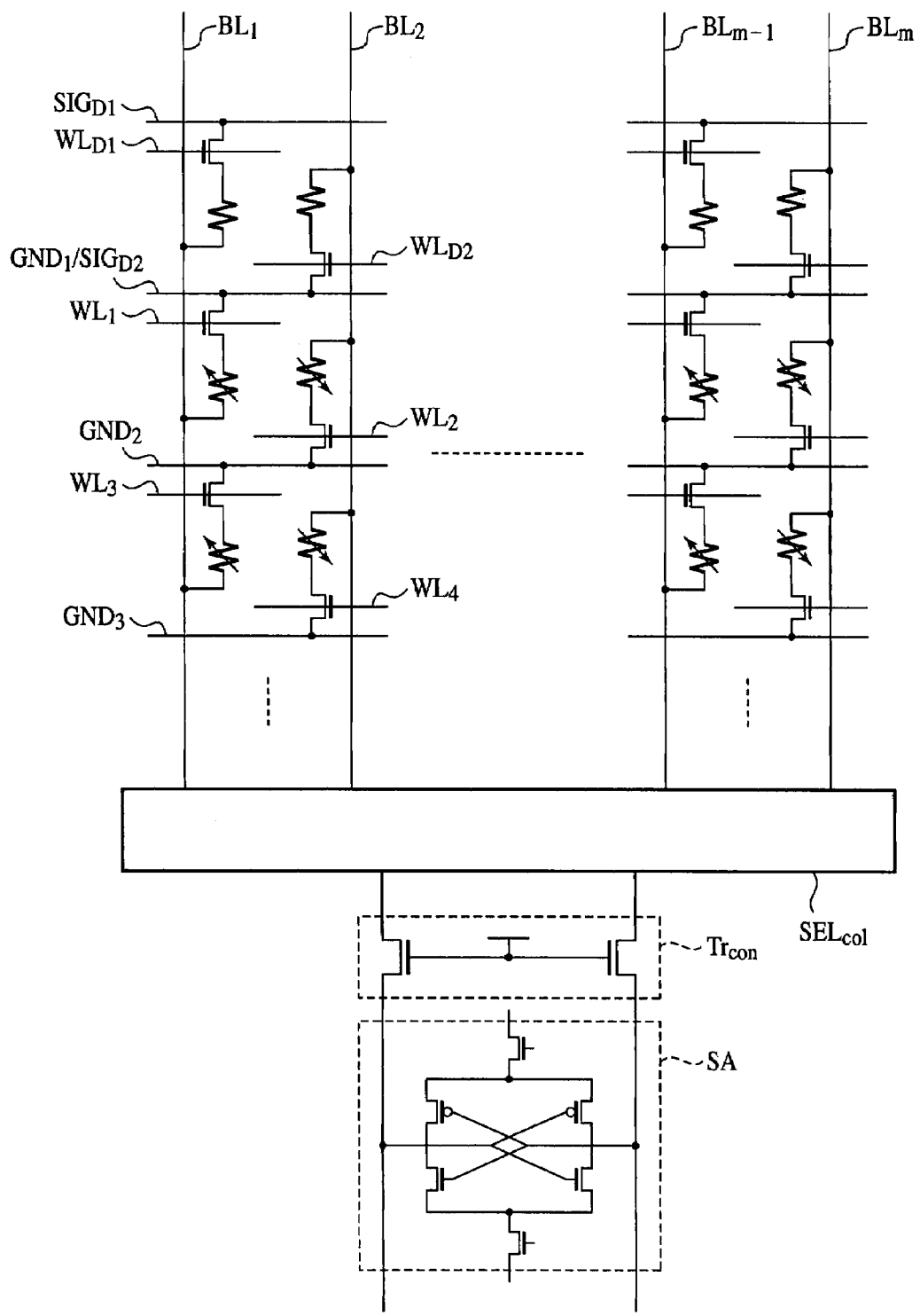
FIG. 13 is a circuit diagram showing a structure of the magnetic memory device according to a third embodiment of the present invention.

FIG. 13 is a circuit diagram showing the structure of the magnetic memory device according to the present embodiment.

The magnetic memory device according to the present embodiment is characterized in that adjacent bit lines BL respectively form pairs and have the so-called folded bit line structure.

That is, as shown in FIG. 13, memory cells MC at odd number-th word lines $WL_1$, $WL_3$, ... are connected to one bit line of a pair of bit lines, and memory cells MC at even number-th word lines $WL_2$, $WL_4$ ... are connected to the other bit line of the pair. The signal line $SIG_{D2}$ connected to the dummy cell DC at the world line $WL_{D2}$ and the ground line $GN_{D1}$ connected to the memory cell MC at the word line $WL_1$ are common. The ground lines GND connected to the memory cells at the even number-th word lines $WL_2$, $WL_4$, ... and the ground lines GND connected to the memory cells MC at the odd number-th word lines $WL_3$, $WL_5$, ... are common.

In the reading operation of the magnetic memory device according to the present embodiment, the bit line (e.g., the bit line $BL_2$) paired with the bit line connected to the memory cell MC to be read (e.g., the bit line $BL_1$) is used as the bit line of the reference side (/BL). A differential signal between a pair of adjacent bit lines is read by a voltage sense amplifier to thereby make the magnetic memory device strong to noises in the memory operation.

As described above, according to the present embodiment, adjacent bit lines form the so-called folded bit line structure, whereby in-phase noises between each pair of bit lines and /bit line can be cancelled. Thus, the noise resistance in the memory operation can be improved.

A Fourth Embodiment

The magnetic memory device according to a fourth embodiment of the present invention will be explained with reference to FIG. 14. The same members of the present embodiment as those of the magnetic memory device according to the first to the third embodiments shown in FIGS. 1 to 13 are represented by the same reference numbers not to repeat or to simplify their explanation.

Figure 14:
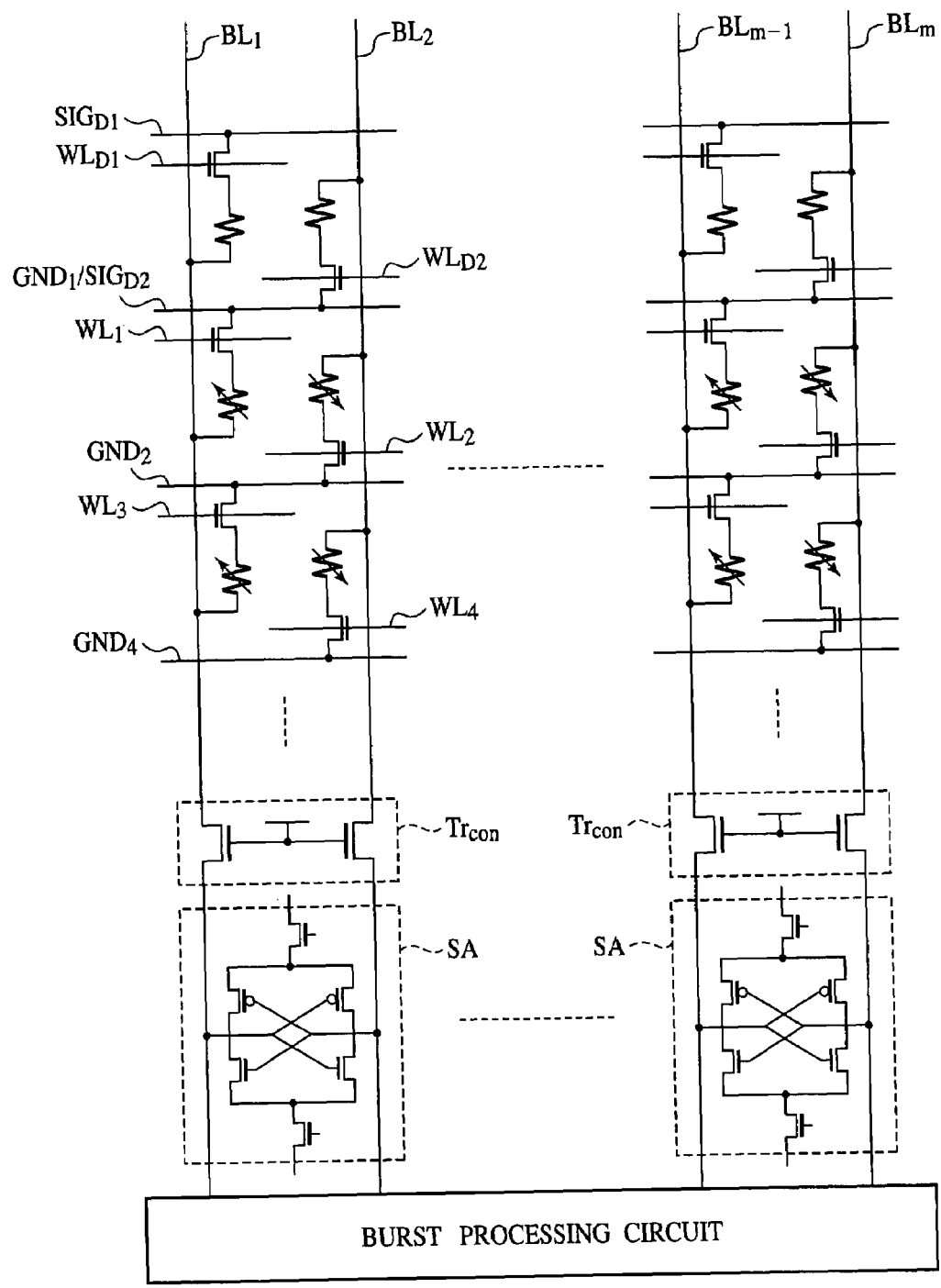
FIG. 14 is a circuit diagram showing a structure of the magnetic memory device according to a fourth embodiment of the present invention.

FIG. 14 is a circuit diagram showing the structure of the magnetic memory device according to the present embodiment.

As shown in FIG. 14, the memory cell array of the magnetic memory device according to the present embodiment is the same as that of the magnetic memory device according to the third embodiment shown in FIG. 13. The magnetic memory device according to the present embodiment is characterized mainly in that voltage sense amplifiers SA are provided for respective pairs of bit lines. The voltage sense amplifiers SA are provided for the respective pairs of bit lines, whereby the column select circuit SEL is unnecessary, and the bit lines BL and the voltage sense amplifiers SA are connected to each other via connection transistors $Tr_{con}$. The voltage sense amplifier of the cross connected type as shown can be formed in a small area, which allows the voltage sense amplifiers can be provided for respective pairs of bit lines without increasing the bit line pitch.

The voltage sense amplifiers SA provided for each pair of bit lines are connected in parallel to a burst processing circuit. Thus, high-speed read in the so-called burst mode, in which data of respective columns are simultaneously read out, and are latched by the voltage sense amplifiers SA for high speed data transfer, can be easily realized.

As described above, according to the present embodiment, the voltage sense amplifiers are provided for respective pairs of folded bit lines, which permits the high-speed signal processing (burst processing) to be used for reading outputs.

A Fifth Embodiment

The magnetic memory device according to a fifth embodiment of the present invention will be explained with reference to FIG. 15. The same reference numbers of the present embodiment as those of the magnetic memory device according to the first to the fourth embodiments shown in FIGS. 1 to 14 are represented by the same reference numbers not to repeat or to simplify their explanation.

Figure 15:
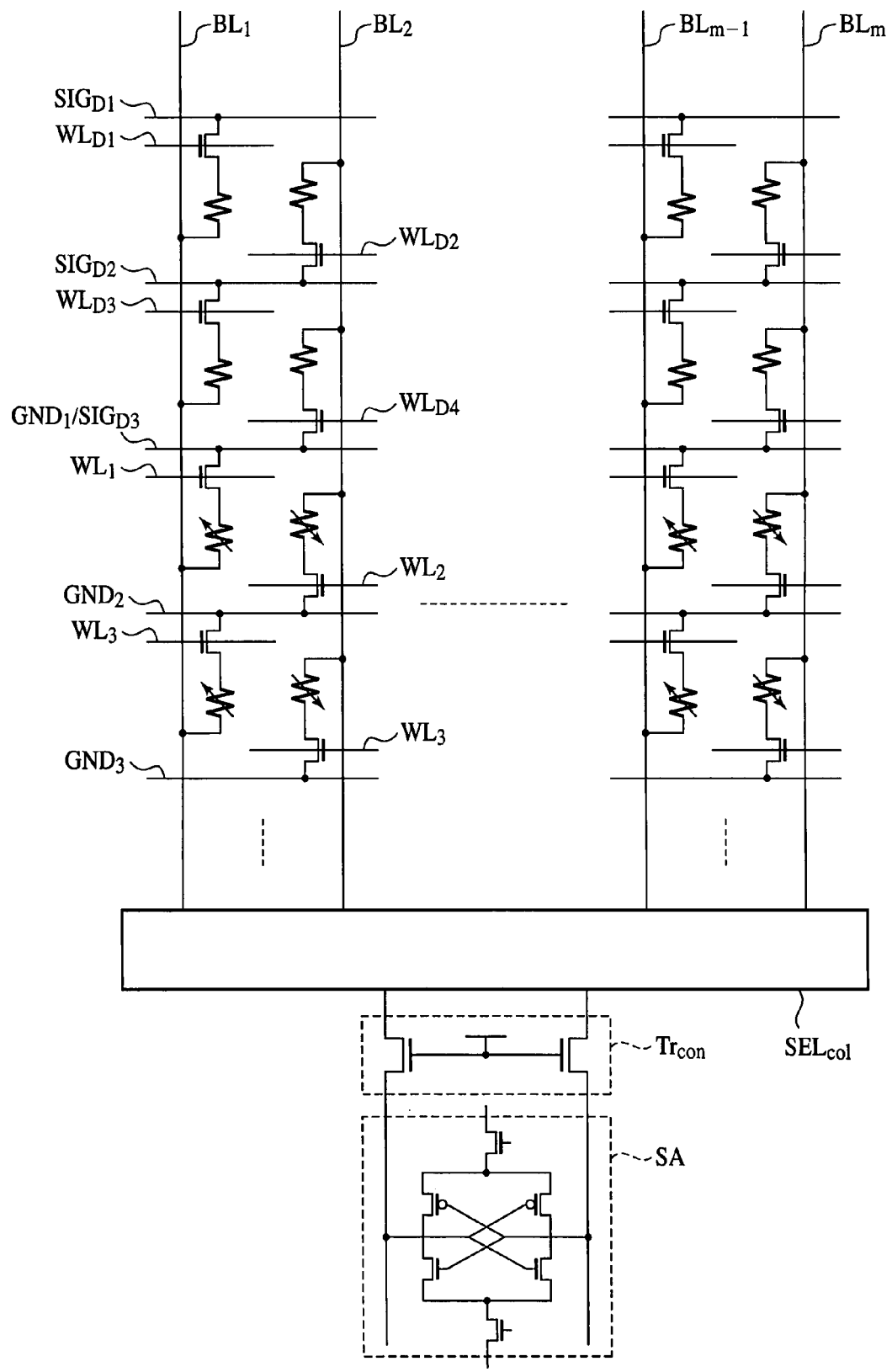
FIG. 15 is a circuit diagram showing a structure of the magnetic memory device according to a fifth embodiment of the present invention.
Figure 16:
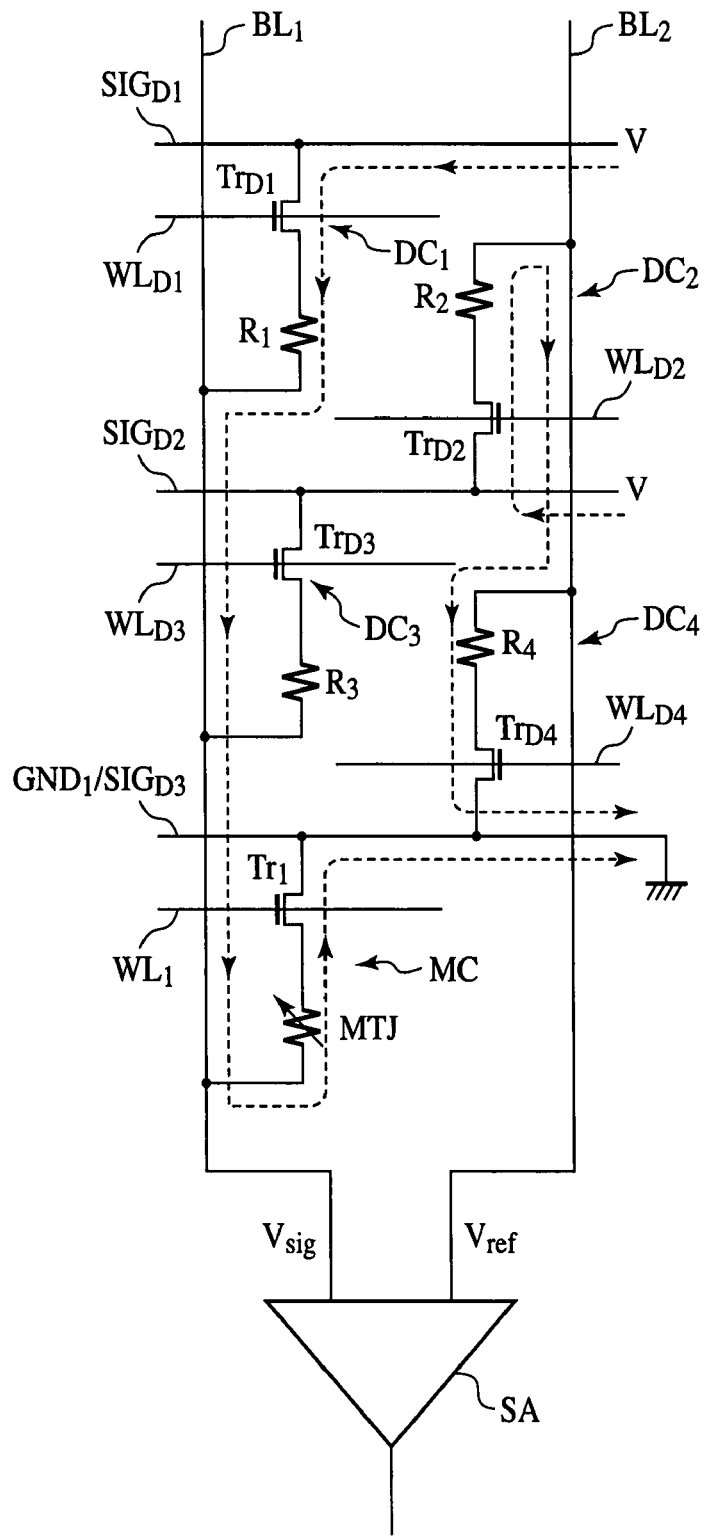
FIG. 16 is a view showing the method for reading the magnetic memory device according to the fifth embodiment of the present invention (Part 1).
Figure 17:
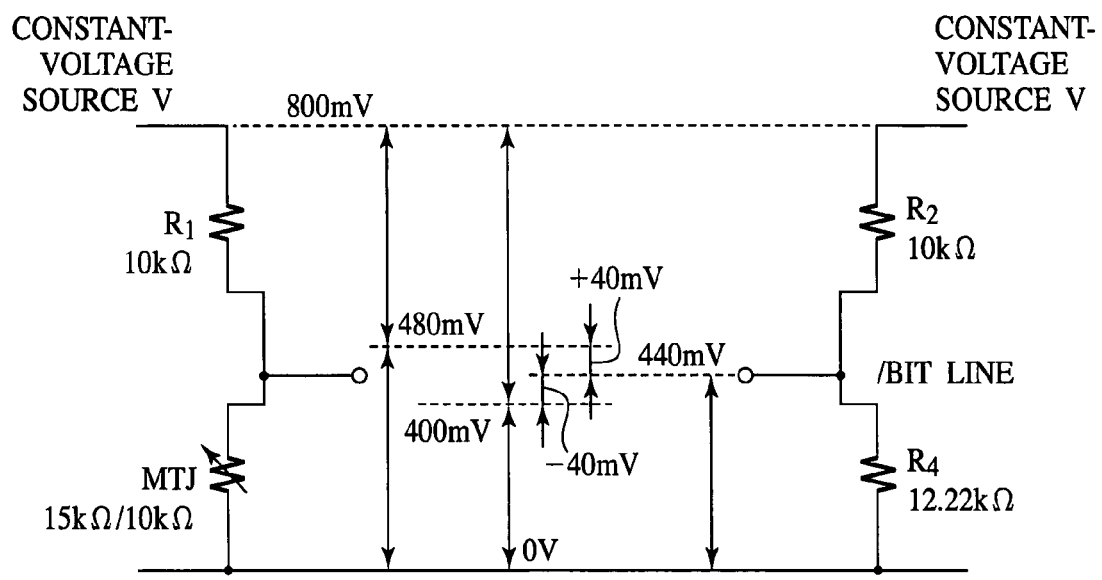
FIG. 17 is a view showing the method for reading the magnetic memory device according to the fifth embodiment of the present invention (Part 2).
Figure 18:
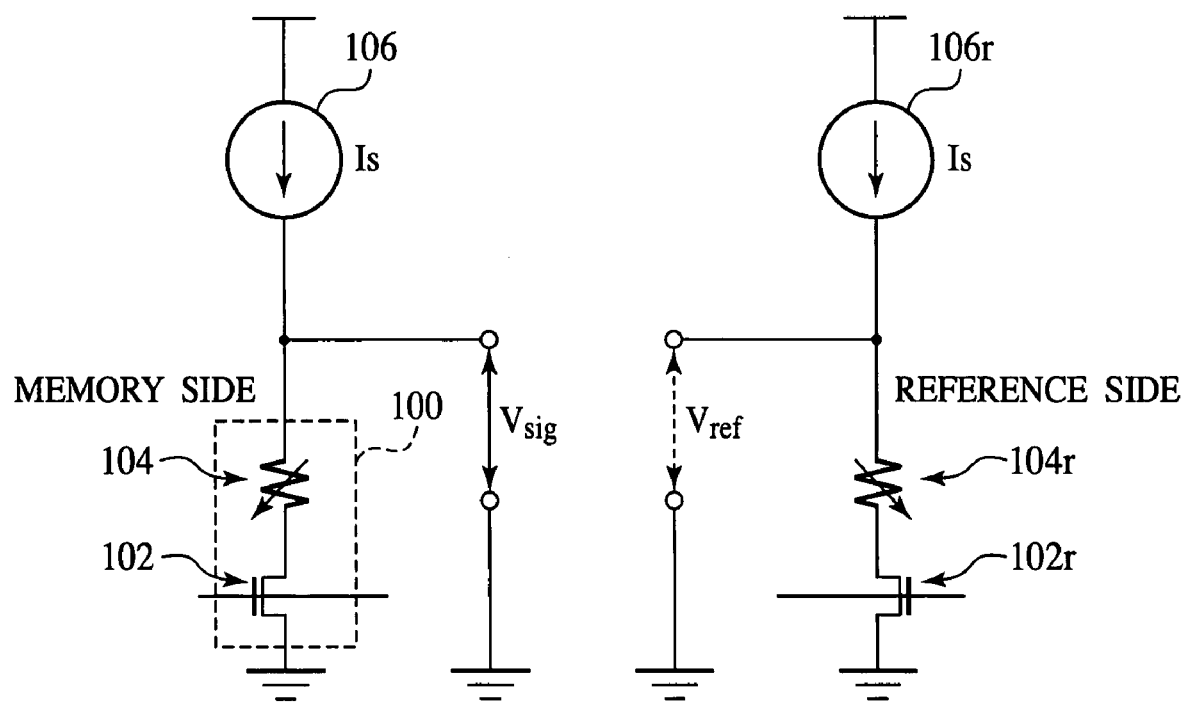
FIG. 18 is a view showing the method for reading the conventional magnetic memory device (Part 1).
Figure 19:
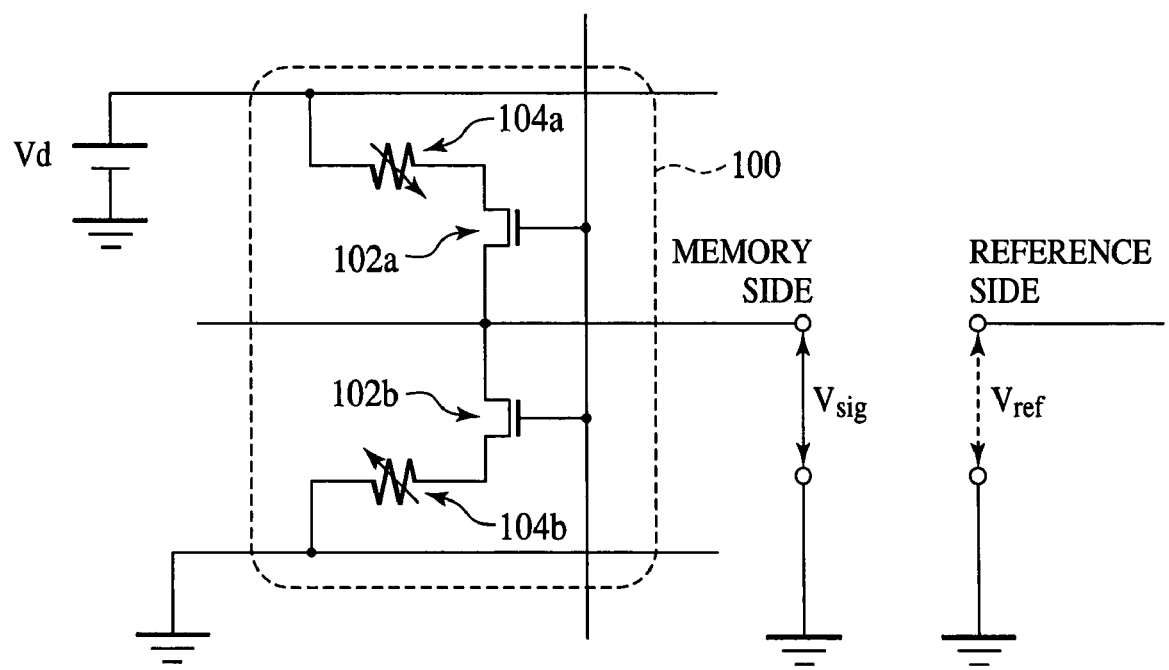
FIG. 19 is a view showing the method for reading the conventional magnetic memory device (Part 2).
Figure 20:
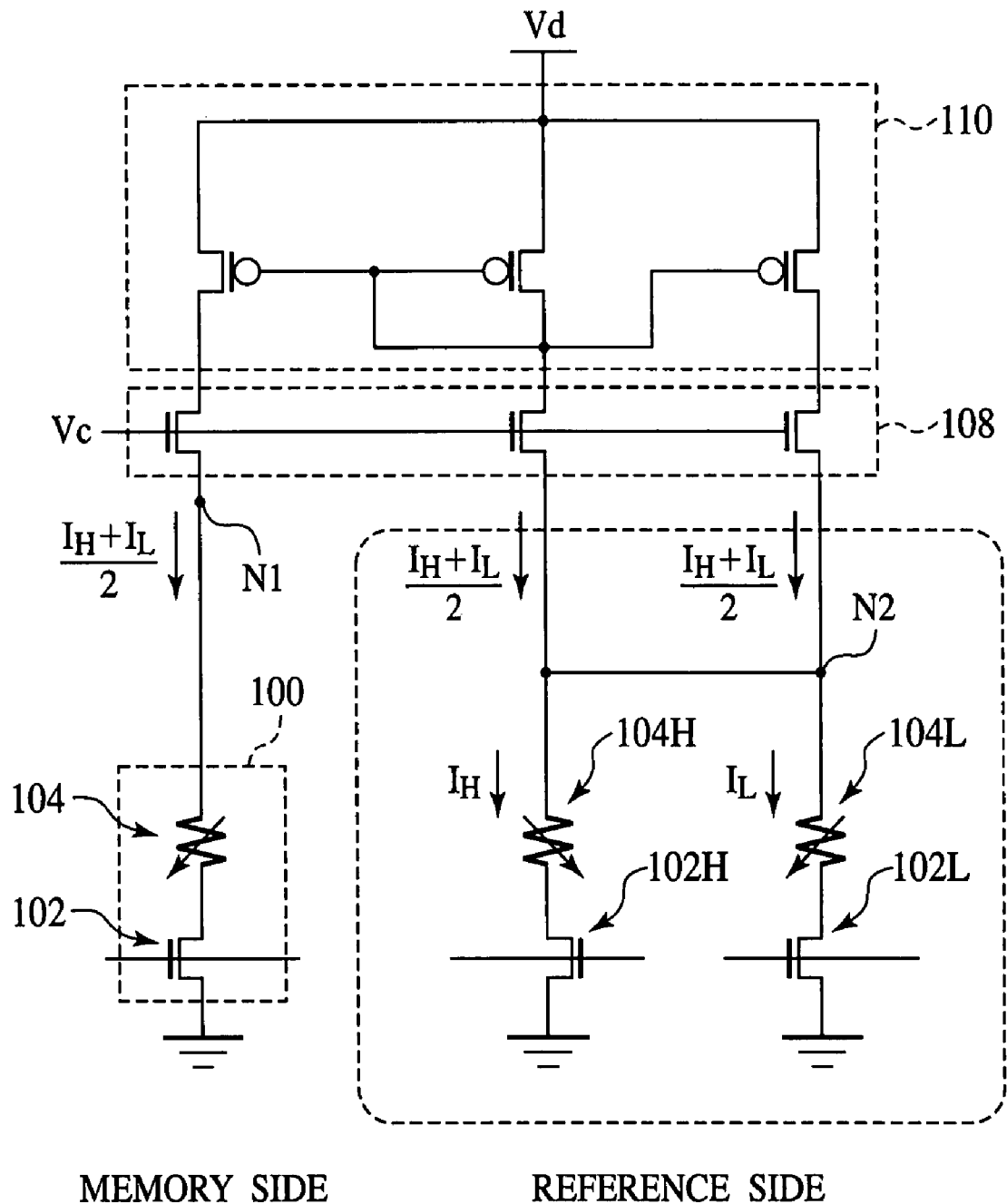
FIG. 20 is a view showing the method for reading the conventional magnetic memory device (Part 3).

FIG. 15 is a circuit diagram showing the structure of the magnetic memory device according to the present embodiment. FIGS. 16 and 17 are views showing the method for reading the magnetic memory device according to the present embodiment.

The magnetic memory device according to the present embodiment is the magnetic memory device according to the third embodiment shown in FIG. 3 which includes two dummy cells DC are provided for each bit line BL.

That is, as shown in FIG. 15, two dummy cells $DC_1$, $DC_2$ at odd number-th word lines $WL_{D1}$, $WL_{D3}$ are connected to one bit line BL of a pair of bit lines, and two dummy cells $DC_2$, $DC_4$ at even number-th word lines $WL_{D2}$, $WL_{D4}$ are connected to the other bit line. The signal line connected to the dummy cell $DC_2$ and the signal line connected to the dummy cell $DC_3$ are a common signal line $SIG_{D2}$. The signal line $SIG_{D3}$ connected to the dummy cell $DC_4$ and the ground line $GND_1$ connected to the memory cell MC associated with the word line $WL_1$ are common.

Next, the method for reading the magnetic memory device according to the present embodiment will be explained with reference to FIGS. 16 and 17.

Here, information memorized in the memory cell connected to the word line $WL_1$, the ground line $GND_1$ and the bit line $BL_1$ is read here.

As shown in FIG. 16, a prescribed read voltage is applied to the signal line $SIG_{D1}$ connected to the select transistor $Tr_{D1}$ of the dummy cell $DC_1$ and the signal line $SIG_{D2}$ connected to the select transistor $Tr_{D2}$ of the dummy cell $DC_2$. The signal line $SIG_{D3}$ (used as the ground line $GND_1$) connected to the select transistor $Tr_{D4}$ of the dummy cell $DC_4$ and the select transistor $Tr_1$ of the memory cell are grounded.

In this state, the select transistor $Tr_1$ of the memory cell MC and the select transistors $Tr_{D1}$, $Tr_{D2}$, $Tr_{D4}$ of the dummy cells DC are turned on. Thus, as shown in FIG. 16, the serial connection of the signal line $SIG_{D1}$, the dummy cell $DC_1$, the bit line $BL_1$, the memory cell MC and the signal line $SIG_{D3}$ is formed. The serial connection of the signal line $SIG_{D2}$, the dummy cell $DC_2$, the bit line $BL_2$, the dummy cell $DC_4$ and the signal line $SIG_{D3}$ is formed. Then, via these serial connections, currents flow from the signal line $SIG_{D1}$ to the signal line $SIG_{D3}$ and from the signal line $SIG_{D2}$ to the signal line $SIG_{D2}$.

FIG. 17 is an equivalent circuit diagram of the state shown in FIG. 16. To simplify the explanation, the respective select transistors are ignored here. It is assumed here that the voltage V of the constant-voltage source to be applied to the signal lines $SIG_{D1}$, $SIG_{D2}$ is 800 mV, the resistance value of the resistance elements $R_1$, $R_2$ is 10 kΩ, the resistance value of the resistance elements $R_2$, $R_4$ is 12.22 kΩ, the resistance value of the high resistance state of the MTJ element MTJ of the memory cell MC is 15 kΩ, and the resistance value of the low resistance state is 10 kΩ.

When the MTJ element MTJ is in the high resistance state, the voltage of the connection node between the resistance element $R_1$ of the dummy cell and the MTJ element MTJ of the memory cell MC, i.e., the voltage $V_{sig,H}$ of the bit line $BL_1$ is, due to the resistance voltage division between the resistance element $R_1$ and the MTJ element MTJ, $$V_{sig,H} = 800\ mV \times 15\ k\Omega/(10\ k\Omega + 15\ k\Omega) = 480\ mV.$$

When the MTJ element MTJ is in the low resistance state, the voltage $V_{sig,L}$ of the bit line $BL_1$ is, due to the resistance voltage division between the resistance element $R_1$ and the MTJ element MTJ, $$V_{sig,L} = 800\ mV \times 10\ k\Omega/(10\ k\Omega + 15\ k\Omega) = 400\ mV.$$

On the other hand, the voltage of the bit line $BL_2$ used as the bit line of the reference side (/BL) is the voltage of the connection node between the resistance element $R_2$ of the dummy cell $DC_2$ and the resistance element $R_4$ of the dummy cell $DC_4$. That is, the voltage $V_{ref}$ of the bit line $BL_2$ is, due to the resistance voltage division between the resistance element $R_2$ and the resistance element $R_4$, $$V_{ref} = 800\ mV \times 12.22\ k\Omega/(10\ k\Omega + 12.22\ k\Omega) = 440\ mV.$$

In this state, the bit lines $BL_1$, $BL_2$ are connected to the voltage sense amplifier SA, whereby the voltage difference ±40 mV between the signal voltage $V_{sig}$ of the bit line $BL_1$ and the reference voltage $V_{ref}$ of the bit line $BL_2$ is amplified, and the information memorized in the MTJ element can be read.

As described above, according to the present embodiment, two dummy cells are provided for each bit line BL, whereby the reference voltage can be generated by the resistance voltage division between the two dummy cells connected to one bit line.

The resistance values of the resistance elements of the dummy cells connected to one bit line are made equal to each other, which more facilitates the design and the manufacturing process.

Modified Embodiments

The present invention is not limited to the above-described embodiments and can cover other various modifications.

For example, in the above-described embodiments, the present invention is applied to the magnetic memory devices including MTJ elements but is widely applicable to magnetic memory devices including the magnetoresistive effect elements using resistance changes based on relationships of spins between magnetic layers. For example, the present invention is applicable to a magnetic memory device including magnetoresistive effect elements comprising two magnetic layers stacked with a non-magnetic layer formed therebetween, and magnetic memory device using spin injection-type tunnel magnetoresistive effect elements.

In the fifth embodiment described above, two dummy cells are provided for each bit line of the magnetic memory device according to the third embodiment to thereby generate the reference voltage. However, in the magnetic memory device according to the other embodiments as well, two dummy cells may be provided for each bit line.

INDUSTRIAL APPLICABILITY

The magnetic memory device according to the present invention and the method for reading the magnetic memory device make it possible to decrease the memory cell area and peripheral circuit area and decrease the electric power consumption, and is useful for the integration and the decrease of the electric power consumption of the magnetic memory devices using resistance changes based on the magnetization directions of the magnetic layers.

The invention claimed is:

1. A magnetic memory device comprising:
a plurality of bit lines;
memory cells disposed at respective of the plurality of bit lines and each of the memory cell including a magnetoresistive effect element and a select transistor connected to the magnetoresistive effect element, the magnetoresistive effect element having one terminal connected to the bit line and the other terminal connected to a first signal line via the select transistor;
first dummy cells disposed at respective of the plurality of bit lines, and each of the first dummy cell including a resistance element of a constant resistance value, the resistance element having one terminal connected to the bit line and the other terminal connected to a second signal line; and
a voltage sense amplifier connected to the plurality of bit lines.

2. The magnetic memory device according to claim 1, further comprising:
a read voltage supply source for applying a prescribed read voltage between the first signal line and the second signal line.

3. The magnetic memory device according to claim 1, further comprising:
reference voltage supply sources disposed at respective of the plurality of bit lines, for applying a prescribed reference voltage to the bit line when information memorized in the memory cell is read.

4. The magnetic memory device according to claim 1, further comprising:
second dummy cells disposed at respective of the plurality of bit lines, and each of the second dummy cell including a resistance element of a constant resistance value, the resistance element having one terminal connected to the bit line and the other terminal connected to a third signal line.

5. The magnetic memory device according to claim 4, further comprising:
a read voltage supply source for applying a prescribed read voltage between the second signal line and the third signal line.

6. The magnetic memory device according to claim 1, further comprising:
a bit line select circuit disposed between said plurality of bit lines and the voltage sense amplifier, for selecting arbitrary two bit lines out of said plurality of bit lines and connecting the two bit lines to the voltage sense amplifier.

7. The magnetic memory device according to claim 1, wherein
said plurality of bit lines are divided in a plurality of pairs of two adjacent bit lines, the two bit lines of each pair having a folded bit line structure.

8. The magnetic memory device according to claim 7, wherein
the voltage sense amplifier is disposed for each of said plurality of pairs of the bit lines.

9. The magnetic memory device according to claim 8, further comprising:
a burst processing circuit connected to the voltage sense amplifiers.

10. The magnetic memory device according to claim 1, further comprising:
between said plurality of bit lines and the voltage sense amplifier, a switching element for synchronously controlling connections between the bit lines and the voltage sense amplifier.

11. The magnetic memory device according to claim 1, wherein
the resistance element is formed of a magnetoresistive effect element of the same structure as the magnetoresistive effect element of the memory cell.

12. The magnetic memory device according to claim 1, wherein
the magnetoresistive effect element is a magnetic tunnel junction element including a pair of magnetic layers formed with a tunnel insulating film formed therebetween.

13. The magnetic memory device according to claim 1, wherein
the dummy cells further include a select transistor between the resistance element and the signal line.

14. A method for reading a magnetic memory device, including a memory cell including a magnetoresistive effect element whose resistance value is changed with changes of a magnetization direction and a select transistor connected to the magnetoresistive effect element, the magnetoresistive effect element having one terminal connected to a first bit line and the other terminal connected to a first signal line via the select transistor; a first dummy cell including a resistance element of a constant resistance value, the resistance element having one terminal connected to the first bit line and the other terminal connected to a second signal line; and a voltage sense amplifier connected to the first bit line, comprising the steps of:
applying a prescribed read voltage between the first signal line and the second signal line; and
reading information memorized in the memory cell by amplifying and comparing a voltage difference between a signal voltage outputted to the first bit line and a reference voltage by the voltage sense amplifier.

15. The method for reading a magnetic memory device according to claim 14, wherein
the reference voltage is applied to a second bit line connected to the voltage sense amplifier.

16. The method for reading a magnetic memory device according to claim 14, wherein
the magnetic memory device further includes a second dummy cell including a resistance element of a constant resistance value, the resistance element having one terminal connected to a second bit line and the other terminal connected to a third signal line; and a third dummy cell including a resistance element of a constant resistance value, the resistance element having one terminal connected to the second bit line and the other terminal connected to a fourth signal line,
the prescribed read voltage being applied between the third signal line and the fourth signal line to thereby output the reference voltage to the voltage sense amplifier via the second bit line.

17. The method for reading a magnetic memory device according to claim 14, wherein
the magnetic memory device further includes between the bit line and the voltage sense amplifier, a switching element for synchronously controlling the connection between the bit line and the voltage sense amplifier,
when the information memorized in the memory cell is read, the switching element is turned on to transmit a voltage of the bit line to the voltage sense amplifier, and the voltage sense amplifier is driven after the switching element is turned off.

18. A method for reading a magnetic memory device, including a plurality of bit lines divided in a plurality of pairs of adjacent two bit lines; memory cells disposed at respective of the plurality of bit lines and each of the memory cell including a magnetoresistive effect element whose resistance value is changed with changes of a magnetization direction, and a select transistor connected to the magnetoresistive effect element, the magnetoresistive effect element having one terminal connected to the bit line and the other terminal connected to a first signal line via the select transistors; first dummy cells disposed at the respective plurality of bit lines and each including a resistance element of a constant voltage value, the resistance element having one terminal connected to the bit line and the other terminal connected to a second signal line; and a plurality of voltage sense amplifiers connected to the respective plurality of pairs of the bit lines, comprising the steps of:
applying a prescribed read voltage between the first signal line and the second signal line; and
simultaneously reading information memorized in the memory cells disposed at said plurality of pairs by the voltage sense amplifier by amplifying and comparing a voltage difference between a signal voltage outputted to the first bit line and a reference voltage.

19. The method for reading a magnetic memory device according to claim 18, wherein
the magnetic memory device further includes second dummy cells disposed at the respective plurality of bit lines and each including a resistance element of a constant resistance value, the resistance element having one terminal connected to the bit line and the other terminal connected to a third signal line,
the prescribed read voltage is applied between the second signal line and the third signal line to thereby output the reference voltage to the bit line.

* * * * *